United States Patent
Narumi

(10) Patent No.: US 10,707,223 B2
(45) Date of Patent: Jul. 7, 2020

(54) FINFET NON-VOLATILE SEMICONDUCTOR MEMORY DEVICE AND METHOD OF MANUFACTURING THE FINFET NON-VOLATILE SEMICONDUCTOR MEMORY DEVICE

(71) Applicant: RENESAS ELECTRONICS CORPORATION, Tokyo (JP)

(72) Inventor: Shunichi Narumi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 35 days.

(21) Appl. No.: 15/819,761

(22) Filed: Nov. 21, 2017

(65) Prior Publication Data

US 2018/0182774 A1    Jun. 28, 2018

(30) Foreign Application Priority Data

Dec. 27, 2016  (JP) ................ 2016-253445

(51) Int. Cl.

| H01L 27/146 | (2006.01) |
|---|---|
| H01L 23/00 | (2006.01) |
| H01L 23/31 | (2006.01) |
| H01L 27/11568 | (2017.01) |
| H01L 29/78 | (2006.01) |
| H01L 29/792 | (2006.01) |

(Continued)

(52) U.S. Cl.
CPC ........ *H01L 27/11568* (2013.01); *H01L 21/02* (2013.01); *H01L 21/02172* (2013.01); *H01L 21/02266* (2013.01); *H01L 27/11565* (2013.01); *H01L 29/40117* (2019.08); *H01L 29/42344* (2013.01); *H01L 29/42348* (2013.01); *H01L 29/66833* (2013.01); *H01L 29/7855* (2013.01); *H01L 29/792* (2013.01); *H01L 29/408* (2013.01); *H01L 29/513* (2013.01); *H01L 29/517* (2013.01); *H01L 29/518* (2013.01)

(58) Field of Classification Search
CPC ............. H01L 27/11568; H01L 29/792; H01L 29/42344
See application file for complete search history.

(56) References Cited

U.S. PATENT DOCUMENTS

| 2006/0022260 A1* | 2/2006 | Hisamoto | ......... H01L 21/28273 257/324 |
|---|---|---|---|
| 2013/0175604 A1* | 7/2013 | Polishchuk | ........... H01L 29/792 257/325 |

OTHER PUBLICATIONS

Tzu-Hsuan Hsu, et al. "A High-Speed BE-SONOS NAND Flash Utilizing the Field-Enhancement Effect of FinFET" IEEE 2007, p. 913-916.

* cited by examiner

*Primary Examiner* — Matthew C Landau
*Assistant Examiner* — Mark Hatzilambrou
(74) *Attorney, Agent, or Firm* — McDermott Will & Emery LLP

(57) ABSTRACT

Characteristics of a semiconductor device having a nonvolatile memory are improved. A high dielectric constant film is provided on an insulating film between a memory gate electrode and a fin as components of a nonvolatile memory. The high dielectric constant film is provided over the top of the fin and the top of an element isolation region, but is not provided over a side surface of the fin. In this way, since the high dielectric constant film is provided over the top of the fin and the top of the element isolation region, it is possible to relax an electric field in the vicinity of each of the upper and lower corner portions of the fin, leading to an improvement in disturbance characteristics.

7 Claims, 37 Drawing Sheets

(51) Int. Cl.
*H01L 29/423* (2006.01)
*H01L 29/66* (2006.01)
*H01L 29/40* (2006.01)
*H01L 29/51* (2006.01)
*H01L 27/11565* (2017.01)
*H01L 21/02* (2006.01)
*H01L 21/28* (2006.01)

FINFET NON-VOLATILE SEMICONDUCTOR MEMORY DEVICE AND METHOD OF MANUFACTURING THE FINFET NON-VOLATILE SEMICONDUCTOR MEMORY DEVICE

CROSS-REFERENCE TO RELATED APPLICATIONS

The disclosure of Japanese Patent Application No. 2016-253445 filed on Dec. 27, 2016 including the specification, drawings and abstract is incorporated herein by reference in its entirety.

BACKGROUND

The present invention relates to a semiconductor device and a method of manufacturing the semiconductor device. For example, the invention can be preferably applied to a nonvolatile memory having FINFET.

In recent years, dimensions of a metal insulator semiconductor field effect transistor (MISFET), which is a component of a large scale integration (LSI) using silicon, have been reduced. In particular, gate length of a gate electrode is steadily decreasing. Along with such a reduction in size of MISFET, it has been difficult to suppress a short channel effect and to maintain current driving force together. FINFET, which is one of such novel structural devices, is intended to increase the current driving force by using a side surface of a FIN (active region) as a channel.

On the other hand, one type of nonvolatile memory includes a memory cell configured of a split gate cell using a metal-oxide-nitride-oxide-semiconductor (MONOS) film. This memory cell is configured of two MISFETs, i.e., a control transistor having a control gate electrode and a memory transistor having a memory gate electrode. Such transistors can also be improved in memory characteristics by using the FIN structure. In addition, a NAND flush memory can also be improved in memory characteristics by using the FIN structure in a memory transistor.

Tzu-Hsuan Hsu, et al. "A High-Speed BE-SONOS NAND Flash Utilizing the Field-Enhancement Effect of FinFET" IEEE 2007 p. 913-916 mentions that in a NAND flush memory, electric charges are injected into a top portion of a fin and then also injected into the side portion of the fin. In particular, it is mentioned that in FN write, the writing speed is fast in the early stage of 1 µs or less and then slowed.

SUMMARY

The inventors are engaged in the research and development of the semiconductor device having such a nonvolatile memory cell, and have investigated further improvement in characteristics of the memory cell by using the FIN structure. Through such investigation, it has been found that a threshold potential is varied after erasing FIN-MONOS, and a deterioration in characteristics, such as disturb, may suspiciously occur. As described above, the structure and the manufacturing method of the nonvolatile memory cell should be further improved in order to use the FIN structure in the nonvolatile memory cell.

Other objects and novel features will be clarified from the description of this specification and the accompanying drawings.

A typical one of embodiments disclosed in the present application is briefly summarized as follows.

A semiconductor device shown in one embodiment disclosed in the present application includes a lamination film including a first insulating film formed between a first gate electrode and a first fin and incorporating a charge storage part, and a high dielectric constant film formed on the first insulating film. The high dielectric constant film of the lamination film is provided over the top of the first fin and the top of an element isolation region, but is not provided over a side surface of the first fin.

A semiconductor device shown in one embodiment disclosed in the present application includes a lamination film including a first insulating film formed between a first gate electrode and a first fin and incorporating a charge storage part, and a high dielectric constant film formed on the first insulating film. Thickness of the high dielectric constant film of the lamination film is larger over the top of the first fin than over the side surface of the first fin, and larger over the top of an element isolation region than over the side surface of the first fin.

A method of manufacturing a semiconductor device shown in one embodiment disclosed in the present application includes the steps of: forming a first insulating film incorporating a charge storage part over a first fin and an element isolation region; and forming a high dielectric constant film on the first insulating film, thereby forming a lamination film of the first insulating film and the high dielectric constant film on the first fin and the element isolation region.

According to the semiconductor device shown in the typical embodiment disclosed herein, characteristics of the semiconductor device can be improved.

According to the method of manufacturing the semiconductor device shown in the typical embodiment disclosed herein, a semiconductor device having good characteristics can be manufactured.

DETAILED DESCRIPTION

Figure 1:
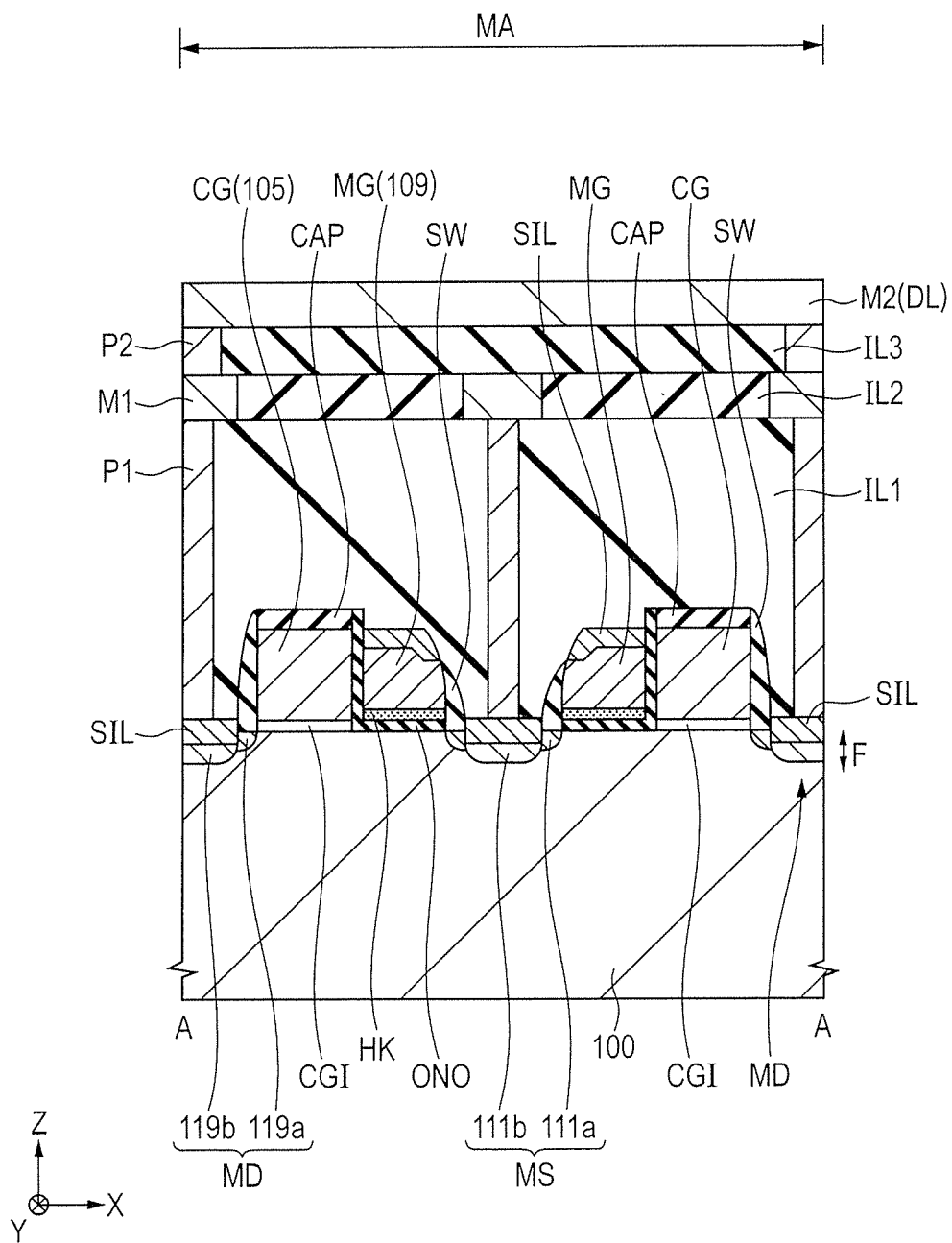
FIG. 1 is a sectional view illustrating a configuration of a semiconductor device of a first embodiment.

Although each of the following embodiments may be dividedly described in a plurality of sections or embodiments for convenience as necessary, they are not unrelated to one another except for the particularly defined case, and are in a relationship where one is a modification, an application example, detailed explanation, supplementary explanation, or the like of part or all of another one. In each of the following embodiments, when the number of elements and the like (including the number, a numerical value, amount, and a range) is mentioned, the number is not limited to a specified number except for the particularly defined case and for the case where the number is principally clearly limited to the mentioned number. In other words, the number may be not less than or not more than the specified number.

Furthermore, it will be appreciated that in each of the following embodiments, a component (including an element step etc.) of the embodiment is not necessarily indispensable except for the particularly defined case and for the case where the component is considered to be indispensable in principle. Similarly, in each of the following embodiments, when a shape or a positional relationship of a component or the like is described, any configuration substantially closely related to or similar to such a shape or the like should be included except for the particularly defined case and for the case where such a configuration is considered to be not included in principle. The same holds true in the number of elements and the like (including the number, a numerical value, amount, and a range).

Hereinafter, some embodiments will be described in detail with reference to the accompanying drawings. In all drawings for explaining the embodiments, components having the same function are designated by the same or the relevant reference numeral, and duplicated description is omitted. If a plurality of similar components (parts) exist, the numeral for a general term may be further marked with a sign to indicate an individual or a particular part. In the following embodiments, the same or similar portion is not repeatedly described in principle except for a particularly required case.

Furthermore, a sectional view for explaining each embodiment may not be hatched for better viewability. A plan view may be hatched for better viewability.

In the sectional views and the plan views, size of each part does not correspond to size of that of an actual device, and a particular site may be illustrated to be relatively large for better viewability. Even if a sectional view corresponds to a plan view, a particular part may be illustrated to be relatively large for better viewability.

First Embodiment

Description of Structure

Hereinafter, a structure of a semiconductor device (semiconductor memory device) of a first embodiment is described with reference to the accompanying drawings. The semiconductor device of the first embodiment includes a memory cell (a memory transistor, a control transistor) formed in a memory cell area MA. The transistor described herein may be referred to as MISFET.

(Description of Structure of Memory Cell)

Figure 2:
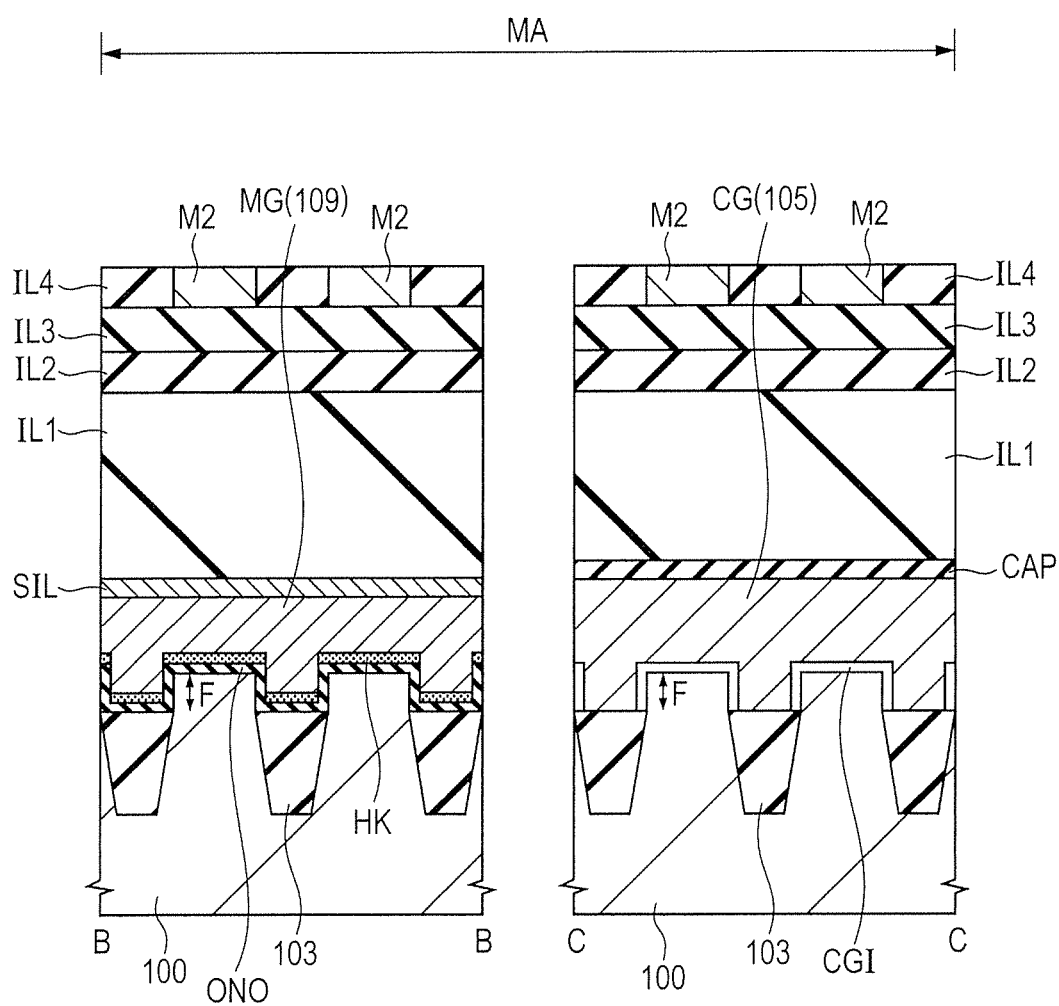
FIG. 2 includes sectional views illustrating the configuration of the semiconductor device of the first embodiment.
Figure 3:
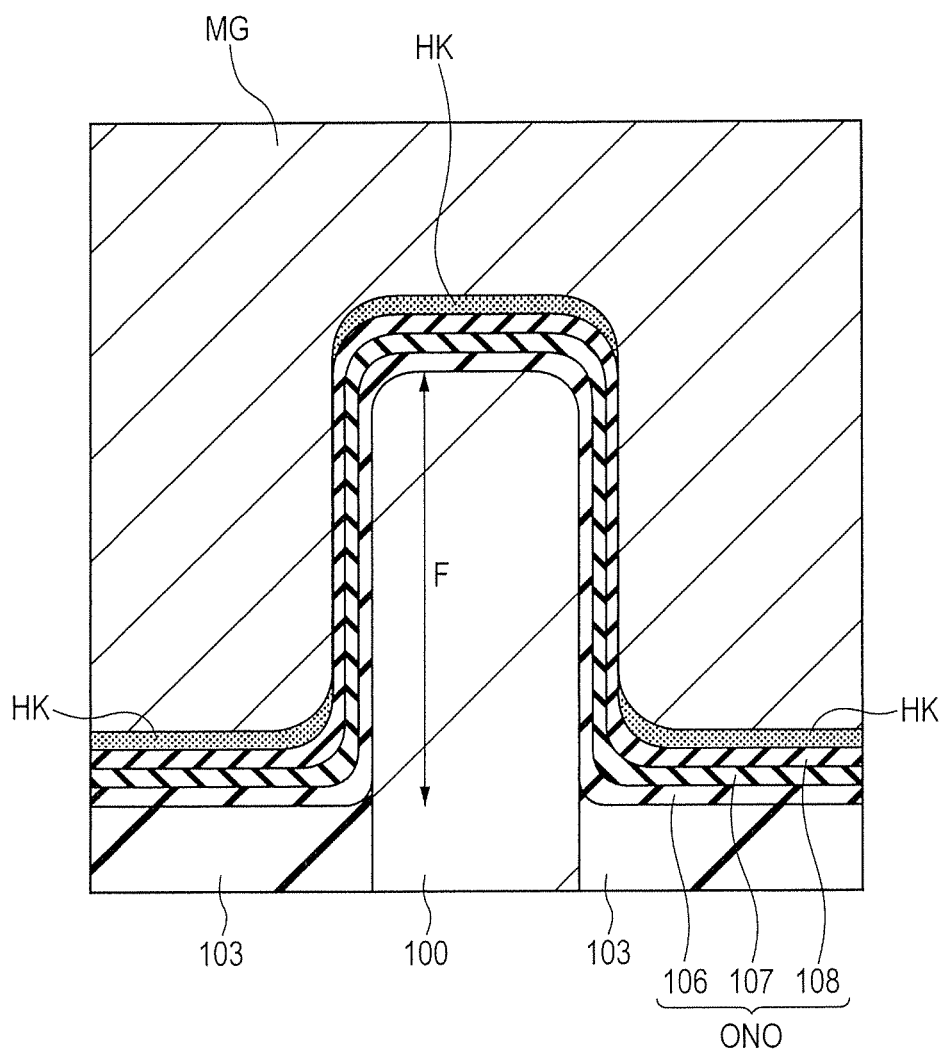
FIG. 3 is a sectional view illustrating the configuration of the semiconductor device of the first embodiment.
Figure 4:
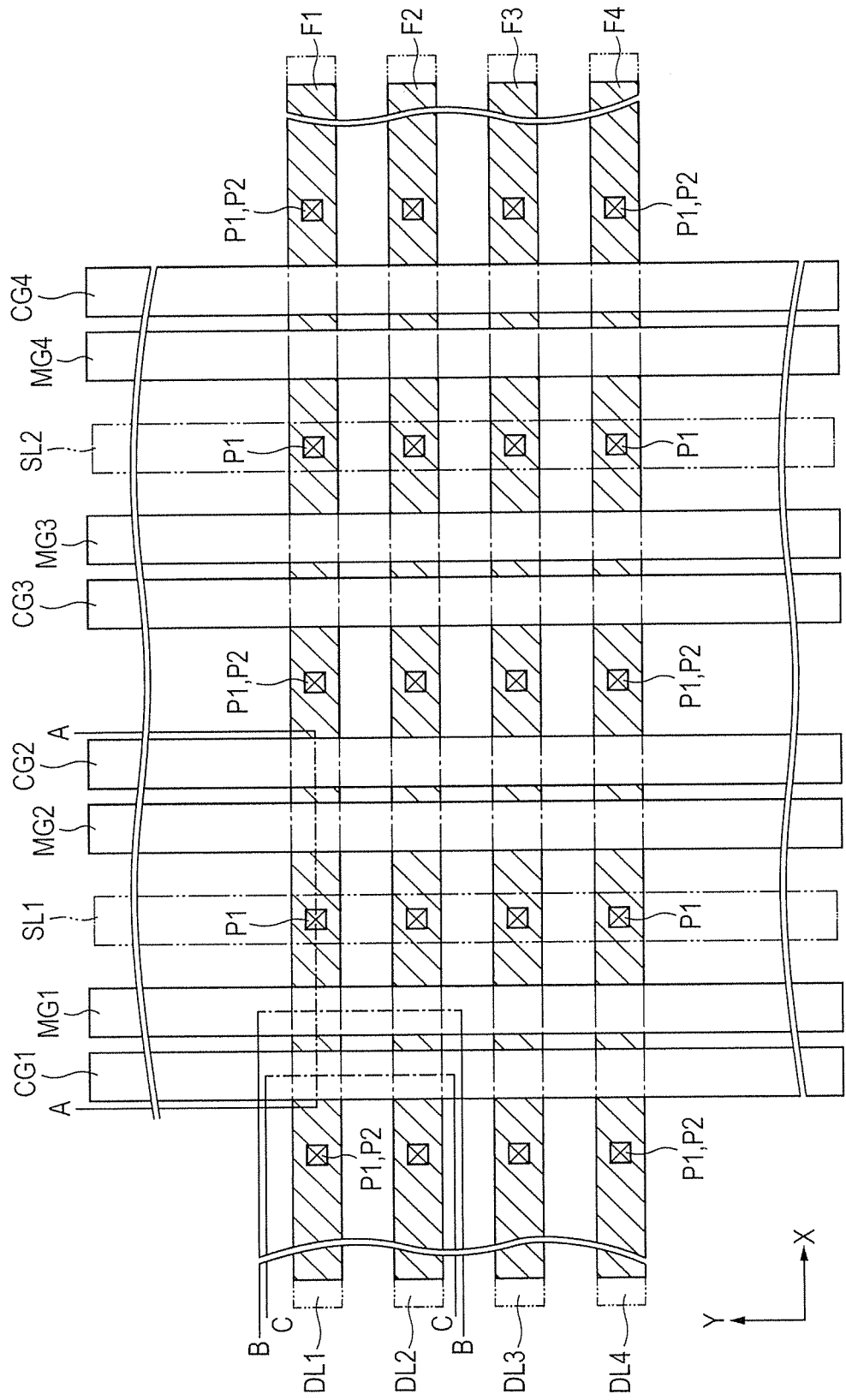
FIG. 4 is a plan view illustrating a memory array of the semiconductor device of the first embodiment.
Figure 5:
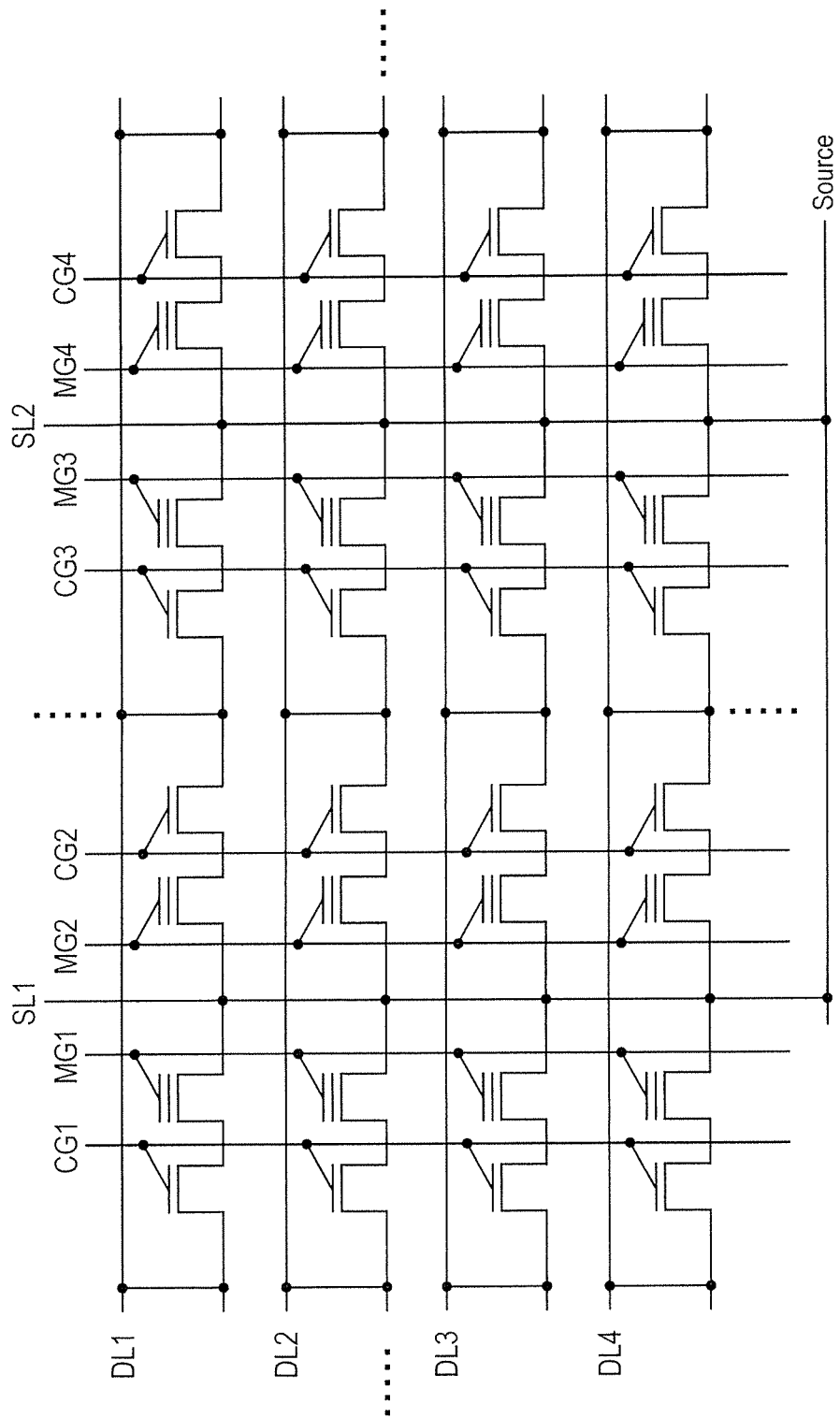
FIG. 5 is a circuit diagram illustrating a memory array of the semiconductor device of the first embodiment.

FIGS. 1 to 3 include sectional views illustrating a configuration of the semiconductor device of the first embodiment. FIG. 4 is a plan view illustrating a memory array of the semiconductor device of the first embodiment. For example, FIG. 1 corresponds to the A-A section in FIG. 4, and FIG. 2 corresponds to the B-B section and the C-C section in FIG. 4. FIG. 3 is a partially enlarged view of the vicinity of a fin F in the left drawing of FIG. 2. FIG. 5 is a circuit diagram illustrating a memory array of the semiconductor device of the first embodiment.

As shown in FIGS. 1 to 4, the memory cell (memory element, element) includes the control transistor having a control gate electrode (control gate electrode part) CG, and the memory transistor having a memory gate electrode (memory gate electrode part) MG. In a dual gate cell (split gate cell) having two transistors as described above, since a gate voltage for read can be set to be smaller than that of a single gate cell having only a memory transistor as described later, read speed can be increased.

The memory cell includes a control gate electrode CG disposed over a semiconductor substrate 100 (fin F), and a memory gate electrode MG disposed over the semiconductor substrate 100 (fin F) and adjacent to the control gate electrode CG. For example, each of the control gate electrode CG and the memory gate electrode MG includes a silicon film.

The control gate electrode CG and the memory gate electrode MG are each disposed over the fin F with the insulating film (CGI, ONO) in between. The fin F is configured of an upper portion of the semiconductor substrate 100. In other words, the semiconductor substrate 100 has irregularities, and the fin F corresponds to a convex portion of the semiconductor substrate 100. As described later, the fin F has a linear planar shape (having a long side in an X direction) having a certain width (length in a Y direction) (see FIG. 4). In FIG. 4, four fins F are arranged with a certain interval (pitch) in the Y direction. A region between the fins F corresponds to an element isolation region 103. The control gate electrode CG and the memory gate electrode MG extend in the Y direction.

A control gate insulating film CGI is disposed between the control gate electrode CG and the semiconductor substrate 100 (fin F). The control gate insulating film CGI includes, for example, a silicon oxide film.

The memory cell further includes an insulating film ONO (106, 107, 108) disposed between the memory gate electrode MG and the semiconductor substrate 100 (fin F). The insulating film ONO includes, for example, a lower insulating film 106, a middle insulating film 107 on the lower insulating film 106, and an upper insulating film 108 on the middle insulating film 107 (see FIG. 3). The middle insulating film 107 serves as a charge storage part. The lower insulating film 106 includes, for example, a silicon oxide film. The middle insulating film 107 includes, for example, a silicon nitride film. The upper insulating film 108 includes, for example, a silicon oxynitride film.

The insulating film ONO (106, 107, 108) is disposed between the memory gate electrode MG and the semiconductor substrate 100 (fin F) and between the control gate electrode CG and the memory gate electrode MG.

In the first embodiment, a high dielectric constant film HK is provided on the insulating film ONO. The high dielectric constant film HK is defined as a film having a higher dielectric constant than a silicon nitride film. For example, the high dielectric constant film HK has a higher dielectric constant than any of films configuring the insulating film ONO (106, 107, 108).

The high dielectric constant film HK is disposed on the insulating film ONO over the top of the fin F and the top of the element isolation region 103, but is not disposed over each side surface of the fin F (see FIG. 3). As described above, in the first embodiment, the high dielectric constant film HK is thus provided on the insulating film ONO, thereby an electric field can be relaxed in the vicinity of each of upper and lower corner portions of the fin F, leading to an improvement in disturbance characteristics. This is described in detail later.

The memory cell further includes a drain region MD and a source region MS formed in the fin F of the semiconductor substrate 100 (see FIG. 1). A sidewall insulating film (sidewall, sidewall spacer) SW including an insulating film is provided on each sidewall portion of the combined pattern of the memory gate electrode MG and the control gate electrode CG.

The drain region MD includes an $n^+$-type semiconductor region 119$b$ and an $n^-$ type semiconductor region 119$a$. The $n^-$ type semiconductor region 119$a$ is formed in a self-aligned manner with a sidewall of the control gate electrode CG. The $n^+$-type semiconductor region 119$b$ is formed in a self-aligned manner with a side surface of the sidewall insulating film SW on the control gate electrode CG, and has a deeper junction depth and a higher impurity concentration than the $n^-$-type semiconductor region 119$a$.

The source region MS includes an $n^+$-type semiconductor region 111$b$ and an $n^-$-type semiconductor region 111$a$. The $n^-$-type semiconductor region 111$a$ is formed in a self-aligned manner with a sidewall of the memory gate electrode MG. The $n^+$-type semiconductor region 111$b$ is formed in a self-aligned manner with a side surface of the sidewall insulating film SW on the memory gate electrode MG, and has a deeper junction depth and a higher impurity concentration than the $n^-$-type semiconductor region 111$a$.

Such a source region (or drain region) including a low-concentration semiconductor region and a high-concentration semiconductor region is referred to as lightly doped drain (LDD) structure.

In this specification, the drain region MD and the source region MS are defined with reference to those in operation. A semiconductor region to which a low voltage is applied for read operation as described later is definitely referred to as source region MS, and a semiconductor region to which a high voltage is applied for read operation is definitely referred to as drain region MD.

A metal silicide film SIL is provided on each of the drain region MD ($n^+$-type semiconductor region 119$b$) and the source region MS ($n^+$-type semiconductor region 111$b$). The metal silicide film SIL is also provided on the memory gate electrode MG. A cap insulating film CAP is provided on the control gate electrode CG. The cap insulating film CAP includes, for example, a silicon nitride film.

Interlayer insulating films IL1, IL2, IL3, and IL4 are provided on the memory cell. Such films include, for example, a silicon oxide film. Plugs P1 are provided in the interlayer insulating film IL1, and a wiring M1 is provided on each plug P1. Plugs P2 are provided in the interlayer insulating film IL3, and a wiring M2 is provided on each plug P2. The wirings M1 and M2 are, for example, embedded wirings and made of a conductive material such as metal. The wirings M1 and M2 are embedded in the interlayer insulating films IL2 and IL4, respectively.

The two memory cells shown in FIG. 1 are disposed substantially symmetrically with respect to the source region MS. As will be described later, a plurality of memory cells are further disposed in the memory cell region MA. For example, an undepicted memory cell sharing the drain region MD is disposed further to the left of the memory cell on the left side of the memory cell region MA shown in FIG. 1.

As described above, a plurality of memory cells are arranged in the horizontal direction (gate length direction) in FIG. 1 such that the shared source regions MS and the shared drain regions MD are alternately disposed, and thus configure a memory cell group (row). In addition, a plurality of memory cells are also arranged in a direction (gate width direction) perpendicular to the paper surface of FIG. 1 to configure a memory cell group (column). In this way, a plurality of memory cells are provided in arrays. The memory array is now described with reference to FIGS. 4 and 5.

(Memory Array)

As shown in FIG. 4, a plurality of fins F (active regions, hatched portions) are provided in lines extending in the X direction. The region between the fins F corresponds to the element isolation region 103 (see FIG. 11).

The control gate electrodes CG (CG1, CG2, CG3, CG4) and the memory gate electrodes MG (MG1, MG2, MG3, MG4) extend in the Y direction (a direction intersecting the A-A section, the longitudinal direction of the paper) so as to transverse the fins F. Source lines SL (SL1, SL2) extend in the Y direction over the fins F so as to transverse the fins F. The source region (MS, n$^+$-type semiconductor region 111$b$) in the fin F is coupled to the source line SL via the plug (contact plug, coupling) P1. On the fins F, the source lines SL (SL1, SL2) are disposed in the Y direction so as to couple between the plugs P1 on the source regions (MS) disposed side by side in the Y direction. The source line SL corresponds to, for example, the first layer wiring (M1).

The control gate electrode CG and the memory gate electrode MG are disposed symmetrically with respect to the source line SL. The drain region MD (n$^+$-type semiconductor region 119$b$) in the fin F is coupled to the drain line DL via the plugs (contact plugs, couplings) P1 and P2. The drain lines DL (DL1, DL2, DL3, DL4) are disposed in the X direction over the respective fins F so as to couple between the plugs P2 over the drain regions MD disposed side by side in the X direction. The drain line DL corresponds to, for example, the second layer wiring (M2).

As shown in FIG. 5, memory cells (memory transistors, control transistors) are arranged in arrays at intersections of the source lines SL (SL1, SL2) and the drain lines DL (DL1, DL2, DL3, DL4).

An undepicted peripheral circuit region is disposed around the periphery of such a memory cell array. Examples of the circuit provided in the peripheral circuit region include a control circuit, a sense amplifier, a column decoder, a row decoder, an input/output circuit, and the like.

(Memory Operation)

Operation of the memory cell is now described. An exemplary condition of voltage application to each part of the memory cell in "write", "erase", or "read" is shown below.

In each of "write", "erase", and "read", a voltage applied to the memory gate electrode MG is denoted by Vmg, a voltage applied to the source region MS is denoted by Vs, a voltage applied to the control gate electrode CG is denoted by Vcg, and a voltage applied to the drain region MD is denoted by Vd. A voltage applied to the fin (p-type well) F is denoted by Vb. The following condition is an exemplary, but not limitative, voltage application condition, and can be variously modified as necessary.

In the first embodiment, injection of electrons into the middle insulating film (silicon nitride film) 107, which is the charge storage part, in the insulating film ONO, is defined as "write", and injection of holes thereinto is defined as "erase". Power supply voltage Vdd is set to 1.5 V.

Write ••• Vd=0.3 V, Vcg=1 V, Vmg=9 V, Vs=5 V, Vb=0 V

Erase ••• Vd=1 V, Vcg=0 V, Vmg=−6 V, Vs=6 V, Vb=0 V

Read ••• Vd=1 V, Vcg=Vdd, Vmg=0 V, Vs=0 V, Vb=0 V

Hot electron write, so-called source side injection (SSI) method, can be used as the write method. For example, the voltages as shown in the column of "write" are applied to the parts of the memory cell to be written, and electrons are injected into the middle insulating film (silicon nitride film) 107 being the charge storage part in the insulating film ONO. Hot electrons are mainly generated in a channel region under the memory gate electrode MG and are injected into the middle insulating film (silicon nitride film) 107 being the charge storage part. The injected hot electrons are trapped in trap levels in the middle insulating film (silicon nitride film) 107 as the charge storage part, resulting in an increase in the threshold voltage (Vth) of the memory transistor.

A hot hole injection erase method using a band-to-band tunneling (BTBT) phenomenon can be used as the erase method. Specifically, holes generated by the BTBT phenomenon are injected into a charge storage part, i.e., the middle insulating film (silicon nitride film) 107 being the charge storage part in the insulating film ONO to perform erase. For example, the voltages as shown in the column of "erase" are applied to the parts of the memory cell to be erased, and holes are generated by the BTBT phenomenon and accelerated by an electric field, thereby the holes are injected into the charge storage part of the memory cell to reduce the threshold voltage of the memory transistor.

An erase method by hole injection using a direct tunneling phenomenon can be used as the erase method. Specifically, holes are injected by the direct tunneling phenomenon into the charge storage part, i.e., the middle insulating film (silicon nitride film) 107 in the insulating film ONO to perform erase. The voltage Vmg applied to the memory gate electrode MG is assumed to be a positive voltage, for example, 12 V, and the voltage Vb applied to the fin (p-type well) F is assumed to be, for example, 0 V. As a result, holes are injected by the direct tunneling phenomenon from the memory gate electrode MG side into the charge storage part, i.e., the middle insulating film 107, through the top insulating film 108, so that the threshold voltage of the memory transistor is reduced, and thus the memory transistor is erased.

For read, for example, the voltages as shown in the column of "read" are applied to the parts of the memory cell to be read. A voltage Vmg applied to the memory gate electrode MG for read is set to a value between the threshold voltage of the memory transistor in a write state and the threshold voltage of the memory transistor in an erase state, thereby the write state can be distinguished from the erase state.

(Considerations)

Considerations by the inventors are now described.

Figure 6:
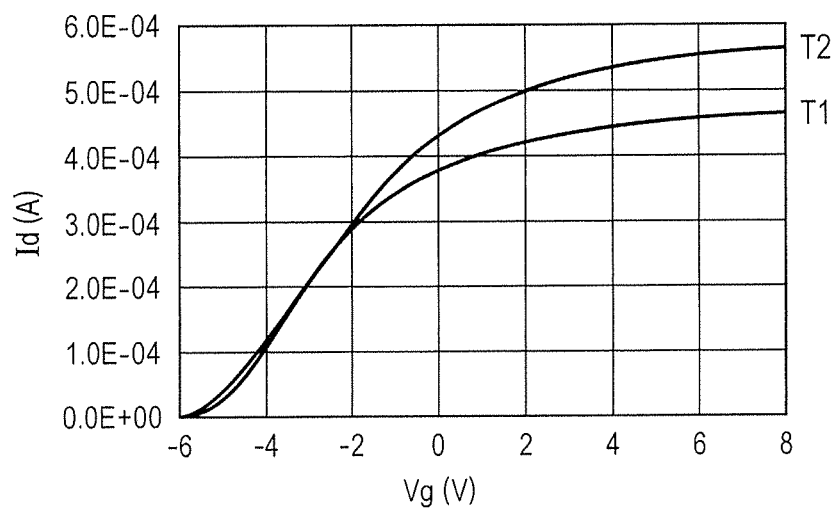
FIG. 6 is a graph showing Id-Vmg measurement results of memory transistors having different fin heights.

(1) Examination is conducted on Id-Vmg characteristics of memory transistors T1 and T2 having different heights of the fins F. FIG. 6 is a graph showing Id-Vmg measurement results of the memory transistors T1 and T2 having different fin heights. Vmg denotes the memory gate voltage [V], and Id denotes the drain current [A.].

The memory transistor T2 has an effective gate length that is about 40% longer than that of the memory transistor T1. However, as shown in FIG. 6, a difference in on current (Id at Vmg of 8 V) is about 25%.

Figure 7:
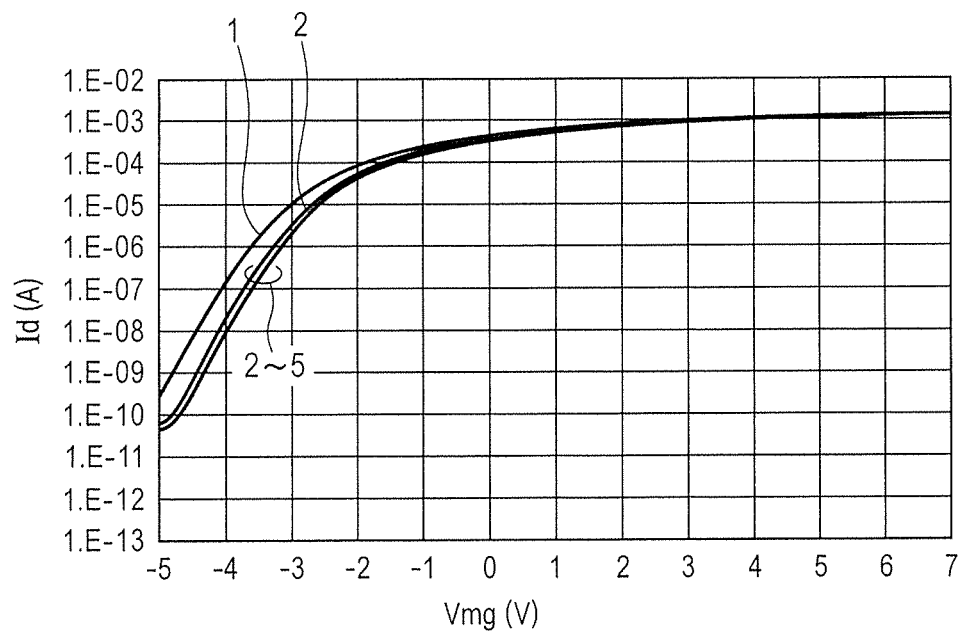
FIG. 7 is a graph showing Id-Vmg measurement results of the memory transistor after erase.

(2) Examination is conducted on Id-Vmg characteristics of the memory transistor after erase. FIG. 7 is a graph showing Id-Vmg measurement results of the memory transistor after erase. Vmg denotes the memory gate voltage [V], and Id denotes the drain current [A].

As shown in FIG. 7, the Id-Vmg characteristics after erase greatly vary between after the first erase and after the second erase. That is, the threshold potential greatly varies between after the first erase and after the second erase. The variation in the threshold potential is small in the second or subsequent erase, i.e., in the second, third, fourth, or fifth erase.

As the sweep range of the memory gate voltage increases, the variation in the threshold voltage increases. Such a phenomenon is not found in the Id-Vmg measurement after write.

Figure 8:
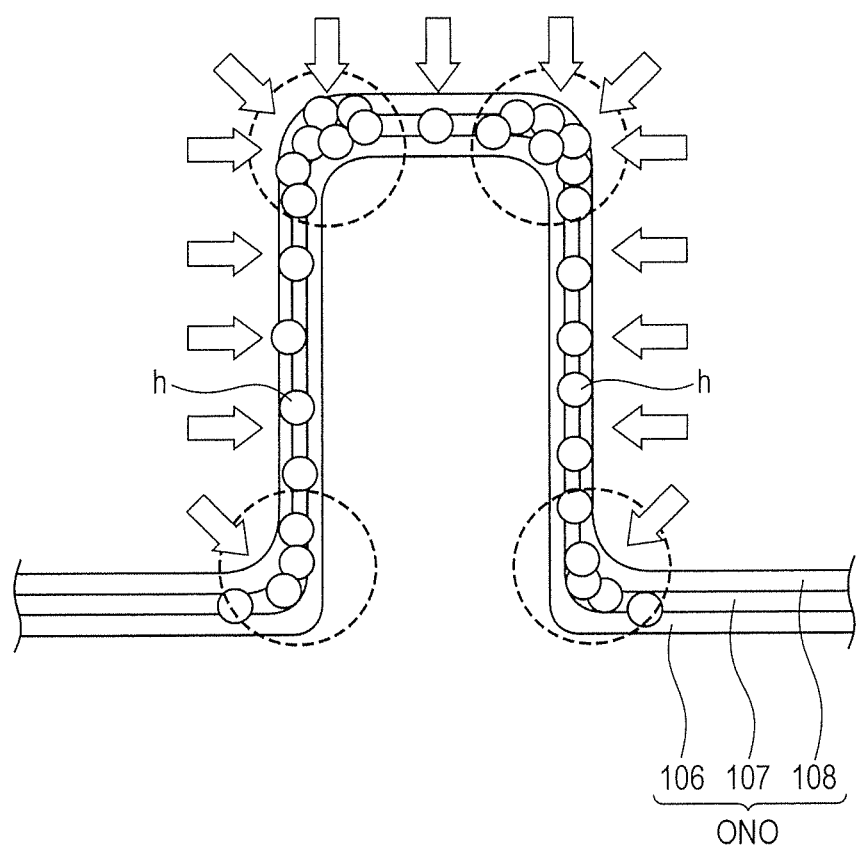
FIG. 8 is a sectional view illustrating a configuration of a semiconductor device of a comparative example.

(3) The results of (1) and (2) suggest that, as shown in FIG. 8, holes h are injected by erase into each corner portion (the portion surrounded by the broken line) of the fin F, and are discharged toward the semiconductor substrate due to the high voltage of the memory gate electrode MG. The electric field intensity on the top of the fin F is estimated to be about 4 times higher than that on the side surface of the fin F. FIG. 8 is a sectional view illustrating a configuration of a semiconductor device of a comparative example.

Such influence of the high voltage of the memory gate electrode MG also occurs on a non-selected cell. This deteriorates the disturb characteristics. In addition, electric field concentration on the corner portion of the fin F leads to deterioration of the insulating film ONO.

Specifically, as the number of times of rewrite increases, more stress accumulates on the memory cell, and the recorded data tend to be lost with time. Only specific blocks (for example, blocks A and B) are assumed to be repeatedly written and erased. At this time, stress is also applied to a block that is neither written nor erased. That is, as described above, a high voltage is also applied to the block that is neither written nor erased. Recorded data is gradually lost (specifically, the threshold voltage is gradually reduced) due to such high-voltage application. This trouble is referred to as "disturb".

On the other hand, in the first embodiment, as shown in FIG. 3, since the high dielectric constant film HK is provided on the insulating film ONO over the top of the fin F and the top of the element isolation region 103, it is possible to relax the electric field in the vicinity of each of the upper and lower corner portions of the fin F, leading to an improvement in disturbance characteristics. In addition, since the high dielectric constant film HK is not provided over each side surface of the fin F, the memory operation at the side surface of the fin F is not blocked by the high dielectric constant film HK.

Examples of a method for forming the high dielectric constant film HK includes the following method. First, a highly directional (highly anisotropic) film formation method is used for forming the high dielectric constant film HK over the fin F with the insulating film ONO in between. The highly directional film formation method includes a sputtering process. In a method for enhancing the directivity of the film, a bias potential is applied to a semiconductor substrate on which a film is to be formed, or a collimator is used. A highly directional CVD process may also not written nor be used.

Figure 23:
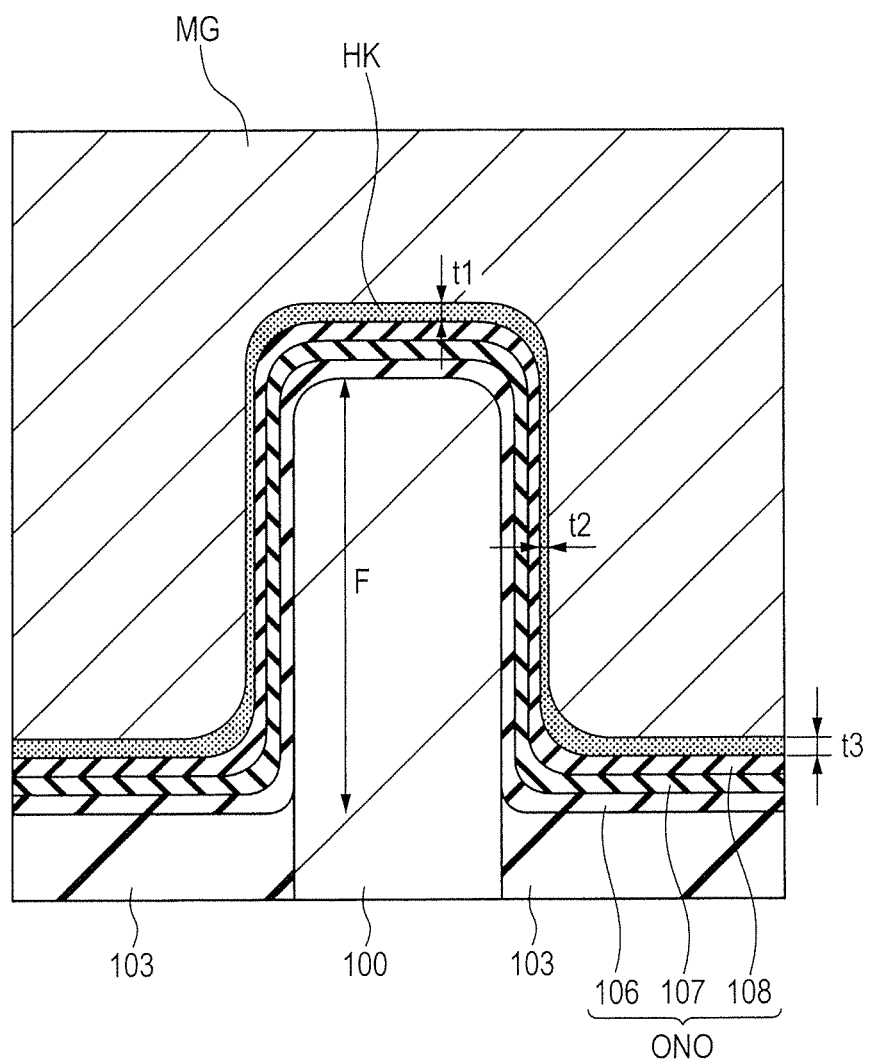
FIG. 23 is a sectional view illustrating the configuration of the semiconductor device of the second embodiment.

When the high dielectric constant film HK is formed by such a highly directional film formation method, a thick film is deposited over the top of the fin F and the top of the element isolation region 103, each top being a flat portion, while a thin film is deposited over each side surface of the fin F (see FIG. 23).

Subsequently, the high dielectric constant film HK is isotropically etched to remove the high dielectric constant film HK by the thickness corresponding to the above-described thin film. As a result, the high dielectric constant film HK remains over the top of the fin F and the top of the element isolation region 103 while having a thickness corresponding to a thickness difference between the thick film and the thin film.

Such highly directional film formation and the isotropic etching are repeated, thereby the high dielectric constant film HK having a desired thickness can be formed only over the top of the fin F and the top of the element isolation region 103.

The thickness of the high dielectric constant film HK is preferably about 1 to 3 times as large as that of the insulating film ONO in terms of a $SiO_2$ film. In addition, a small thickness of the high dielectric constant film HK is achieved due to its high dielectric performance.

For example, an $Al_2O_3$ film, a HfO film, a $Ta_2O_5$ film, a $SiTiO_3$ film, a HfSiO film, a ZrSiON film, and a HfSiON film can be used as the high dielectric constant film HK.

Although the variation in the threshold is not found in the Id-Vmg measurement after write, retention characteristics of electrons injected into the corner portion of the fin F may be suspiciously impaired along with size reduction or a variation in applied voltage in the same way as the holes. Even in such a case, in the first embodiment, the high dielectric constant film HK improves the electron retention characteristics, leading to an improvement in each of erase/write endurance characteristics, disturbance characteristics, and retention characteristics.

Description of Manufacturing Method

A method of manufacturing the semiconductor device of the first embodiment is now described with reference to FIGS. 9 to 19 while the configuration of the semiconductor device is further clarified. FIGS. 9 to 19 include sectional views illustrating a manufacturing process of the semiconductor device of the first embodiment (except for FIG. 11). FIG. 11 is a plan view illustrating the manufacturing process of the semiconductor device of the first embodiment.

Figure 9:
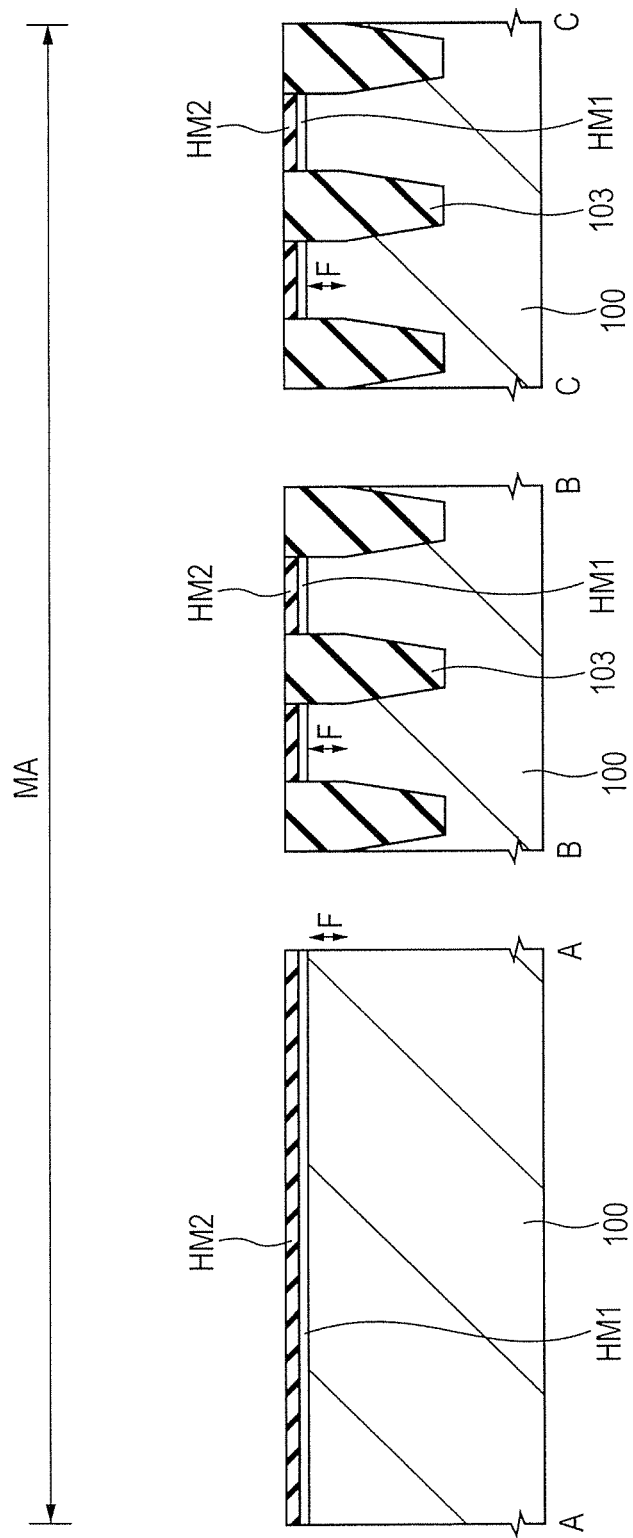
FIG. 9 includes sectional views illustrating a manufacturing process of the semiconductor device of the first embodiment.

First, as shown in FIG. 9, a semiconductor substrate made of p-type single crystal silicon having a specific resistance of, for example, about 1 to 10 Ω·cm is provided as the semiconductor substrate 100. Subsequently, the semiconductor substrate 100 is thermally oxidized to form a silicon oxide film HM1 about 10 nm thick. Subsequently, a silicon nitride film HM2 about 100 nm thick is deposited on the silicon oxide film HM1 by a chemical vapor deposition (CVD) process or the like. Subsequently, the silicon oxide film HM1 and the silicon nitride film HM2 are etched using a photolithography technique and a dry etching technique, and the semiconductor substrate 100 is etched by about 400 nm to form an element isolation trench. Subsequently, a silicon oxide film (embedded insulating film) about 1000 nm thick is deposited on the silicon nitride film HM2 including the inside of the element isolation trench by a CVD process or the like. Subsequently, the silicon oxide film is subjected to heat treatment (annealing) so as to be densified, and then the silicon oxide film outside the element isolation trench is removed by a chemical mechanical polishing (CMP) process or the like, thereby an insulating film such as the silicon oxide film is embedded in the element isolation trench. Such an element isolation method is referred to as shallow trench isolation (STI) method. In the memory cell region MA, for example, the element isolation region 103 has a linear shape (having a long side in the X direction) having a certain width (length in the Y direction). A plurality of linear element isolation regions 103 are arranged with a certain interval (pitch) in the Y direction.

Figure 10:
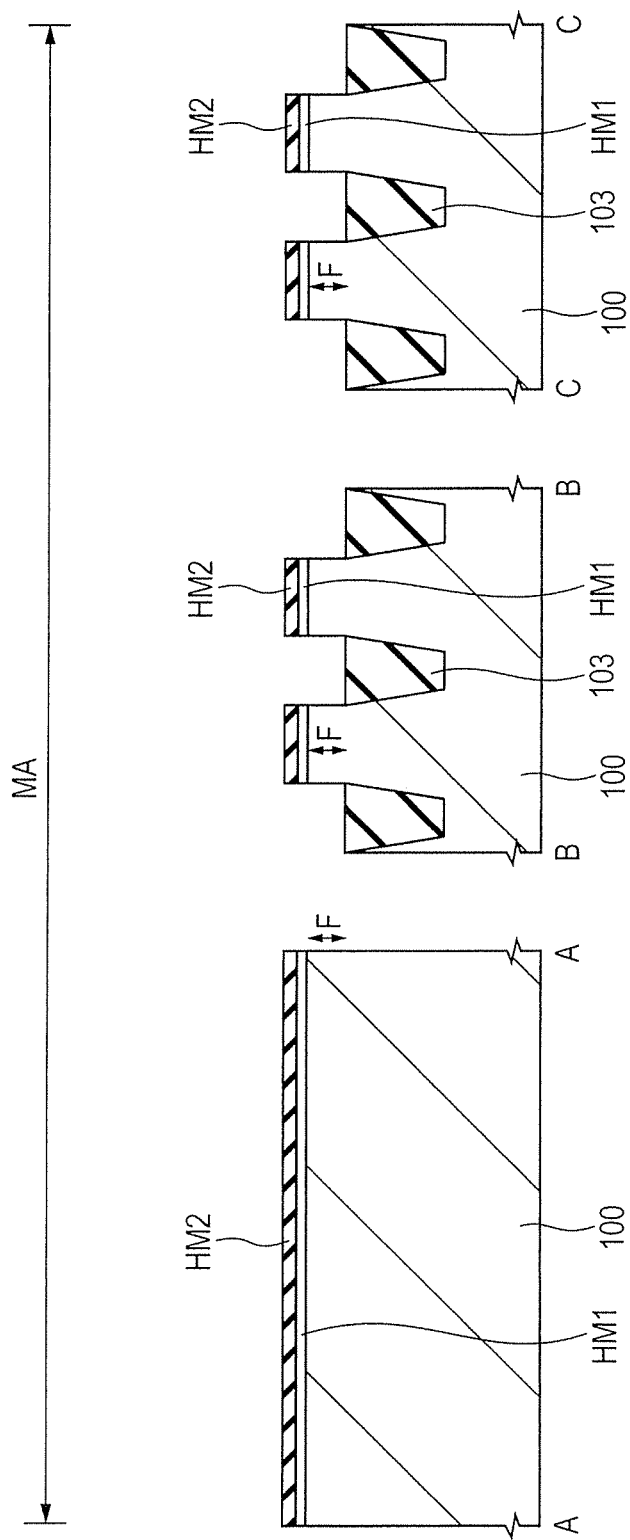
FIG. 10 includes sectional views illustrating the manufacturing process of the semiconductor device of the first embodiment.
Figure 11:
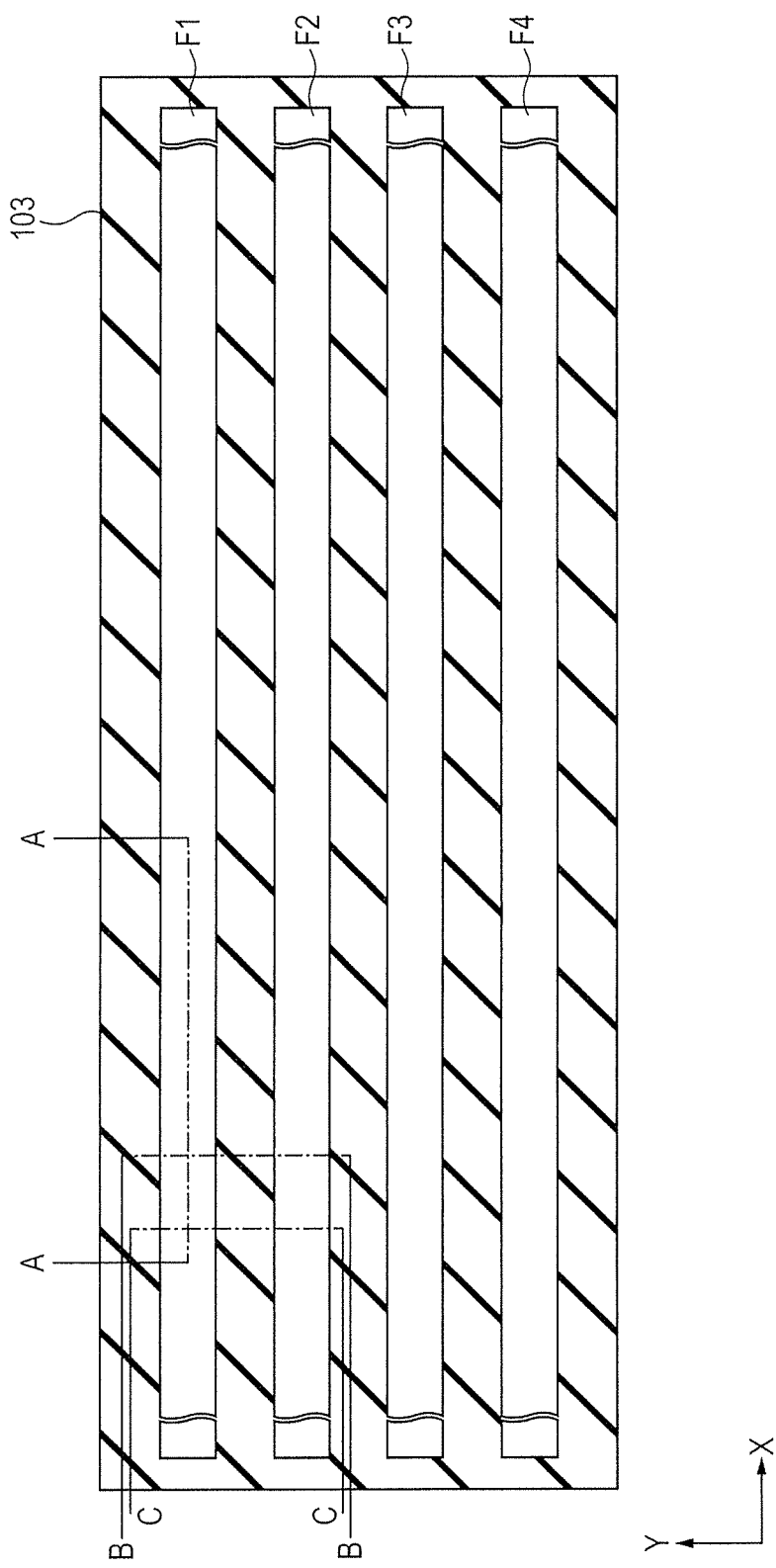
FIG. 11 is a plan view illustrating the manufacturing process of the semiconductor device of the first embodiment.

Subsequently, the surface of each element isolation region 103 in the memory cell region MA is retracted as shown in FIGS. 10 and 11. For example, the surface of the element isolation region 103 in the memory cell region MA is retracted by a certain amount by wet etching. The retraction amount is, for example, about 50 nm.

Consequently, in the memory cell region MA, an upper portion of the semiconductor substrate 100 between the element isolation regions 103 becomes a protrusion. Such a protrusion serves as the fin F (see a hatched portion in FIG. 4 and FIG. 11). In other words, the surface of the element isolation region 103 is lower than the top of the fin F, and the linear element isolation regions 103 and the linear fins F are alternately arranged while having such a difference of altitude.

Subsequently, the silicon nitride film HM2 is removed, and a p-type impurity (for example, boron (B)) is ion-implanted with the silicon oxide film HM1 as a through film. As a result, the p-type impurity is introduced into the fin F (semiconductor substrate 100 (fin F)). The region containing the p-type impurity introduced therein is referred to as p-type well (not shown). Subsequently, the silicon oxide film HM1 is removed.

Figure 12:
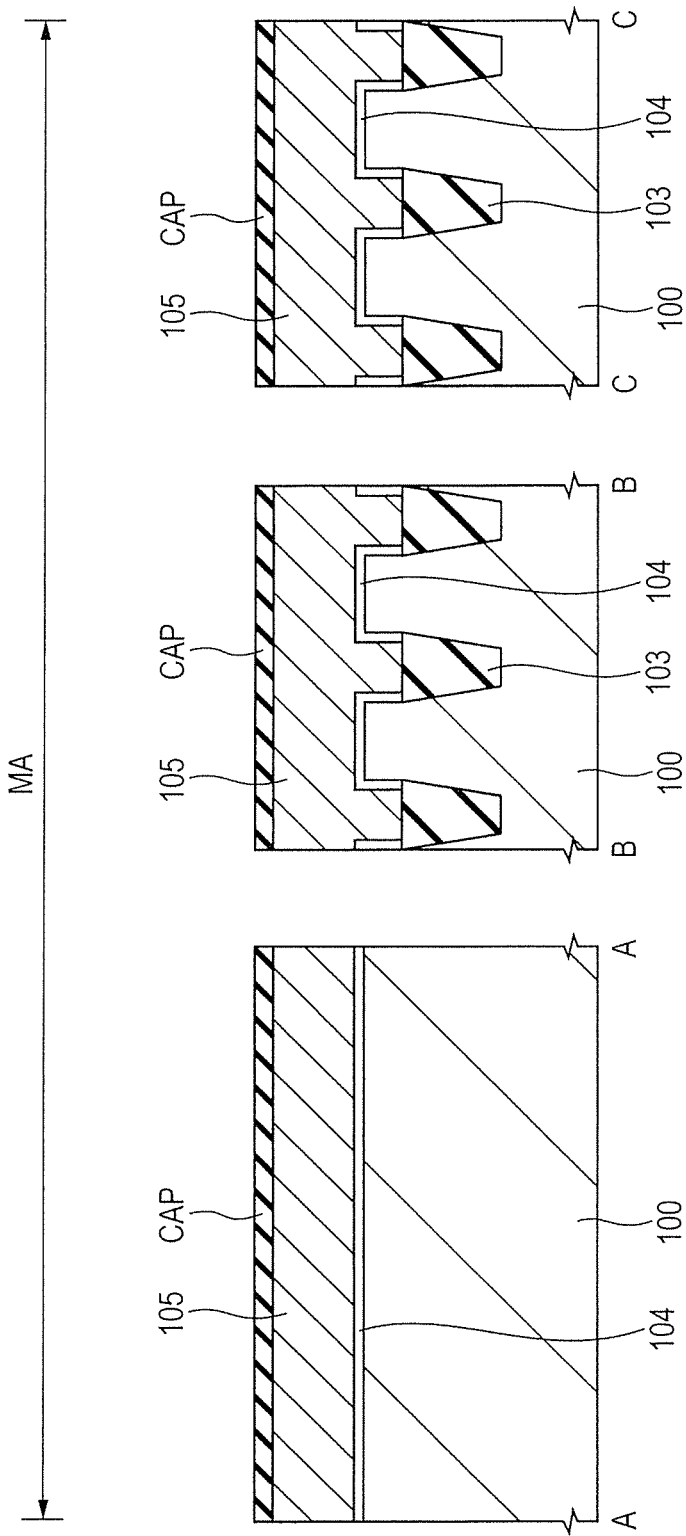
FIG. 12 includes sectional views illustrating the manufacturing process of the semiconductor device of the first embodiment.

Subsequently, as shown in FIG. 12, the insulating film 104 is formed on the semiconductor substrate 100 (fin F). The insulating film 104 serves as the control gate insulating film CGI. For example, a silicon oxide film about 2 nm thick is formed by thermal oxidation on the semiconductor substrate 100 (fin F). Subsequently, a polysilicon film (conductive film) 105 for the control gate electrode CG is formed on the insulating film 104 (CGI). For example, a polysilicon film 105 (CG, GE) about 120 nm thick is formed by a CVD process or the like on the insulating film 104 (CGI) and the element isolation region 103. Subsequently, a cap insulating film CAP is formed on the polysilicon film 105 (CG). For example, a silicon nitride film about 80 nm thick is formed by a CVD process or the like on the polysilicon film 105 (CG).

Figure 13:
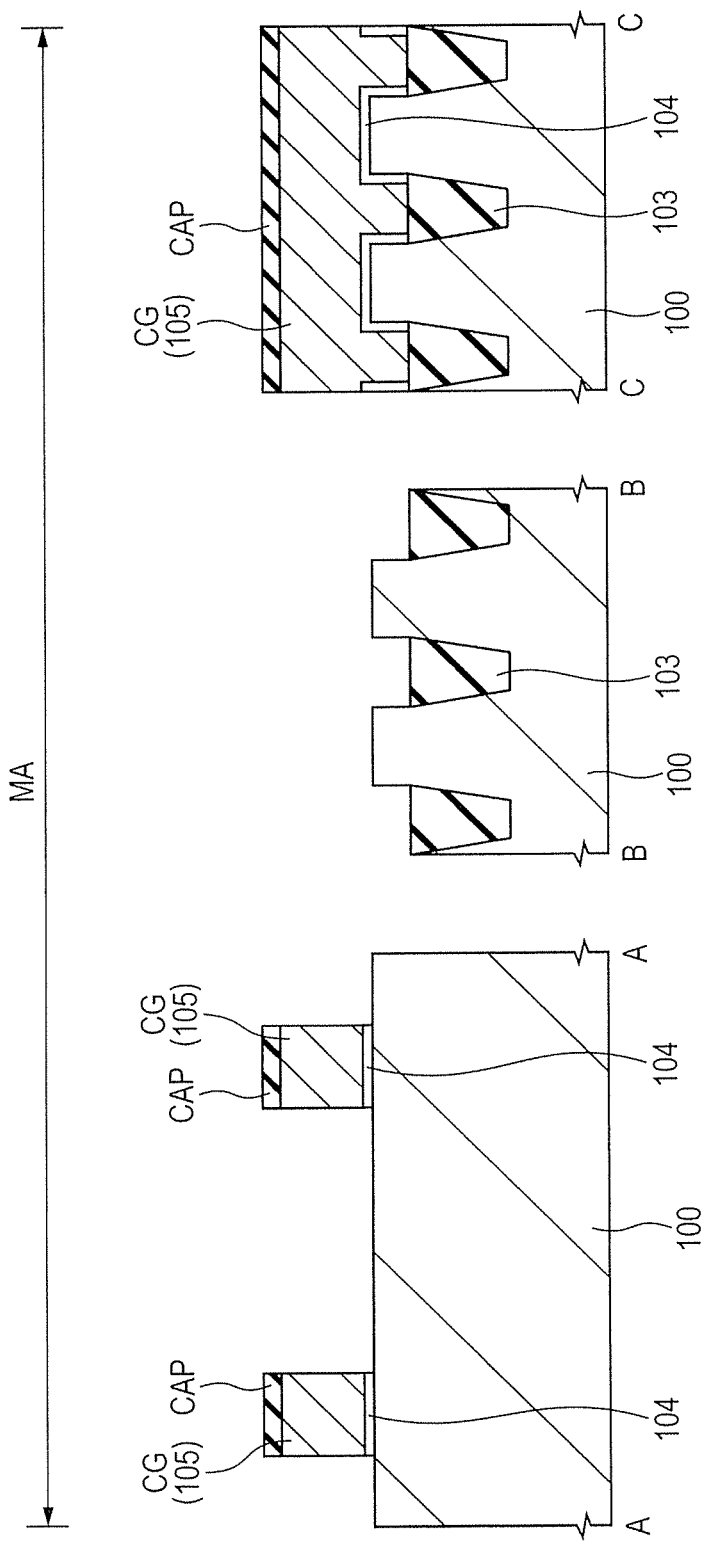
FIG. 13 includes sectional views illustrating the manufacturing process of the semiconductor device of the first embodiment.

Subsequently, as shown in FIG. 13, the lamination film of the insulating film 104 and the polysilicon film 105 is patterned using a photolithography technique and a dry etching technique to form the control gate electrode CG.

Figure 14:
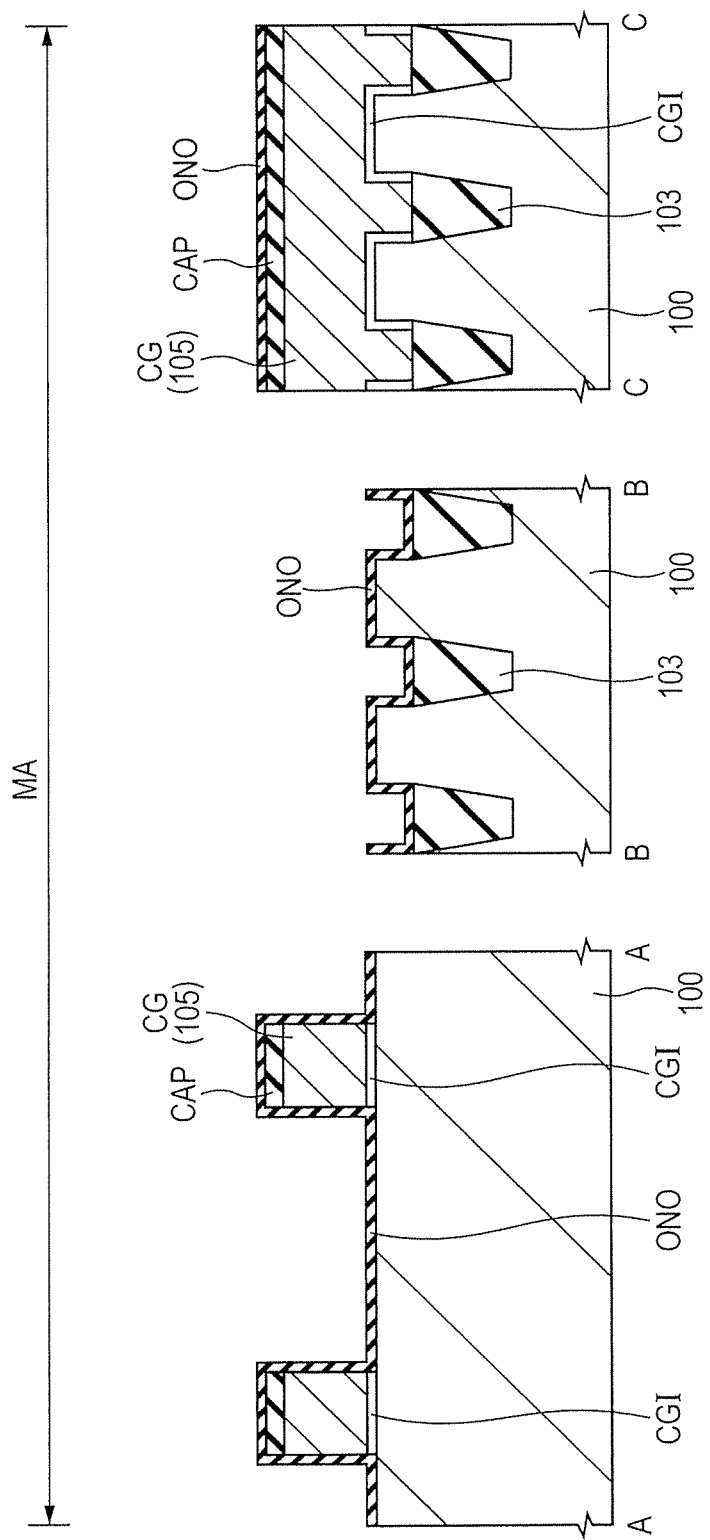
FIG. 14 includes sectional views illustrating the manufacturing process of the semiconductor device of the first embodiment.
Figure 15:
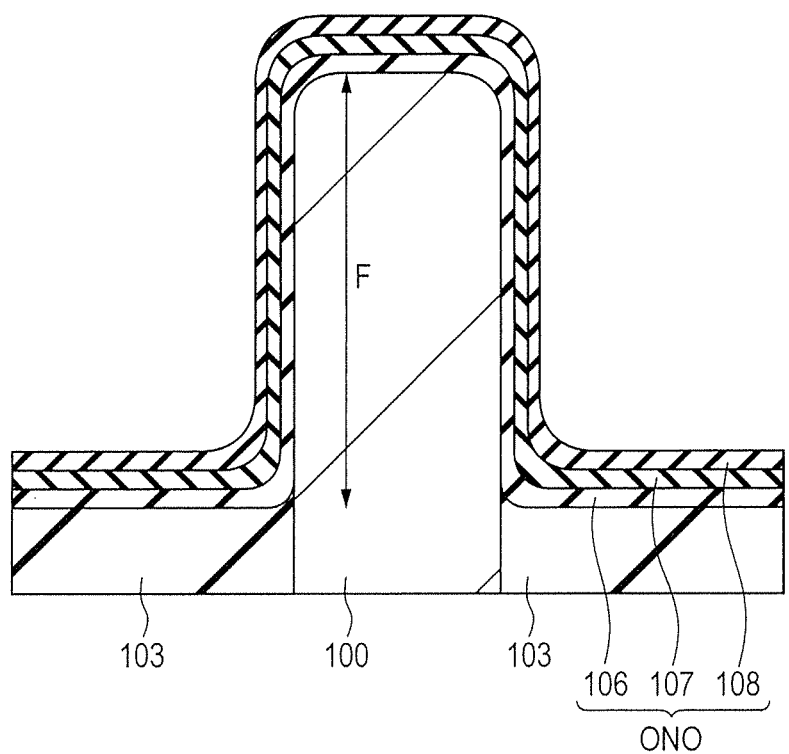
FIG. 15 is a sectional view illustrating the manufacturing process of the semiconductor device of the first embodiment.

Subsequently, as shown in FIGS. 14 and 15, the insulating film ONO (106, 107, 108) is formed. First, as shown in FIG. 15, for example, a silicon oxide film is formed as the lower insulating film 106 over the semiconductor substrate 100 (fin F) including the control gate electrode CG. The silicon oxide film is formed about 4 to 7 nm in thickness by a thermal oxidation process, for example. The silicon oxide film may be formed by a CVD process or the like. Subsequently, for example, a silicon nitride film as the middle insulating film 107 is deposited about 7 nm in thickness on the lower insulating film 106 by a CVD process or the like. The middle insulating film 107 serves as the charge storage part of the memory cell. Subsequently, for example, a silicon oxide film as the upper insulating film 108 is deposited about 9 nm in thickness on the middle insulating film 107 by a CVD process or the like. The thickness of each film configuring the insulating film ONO (106, 107, 108) can be appropriately varied depending on an operation method of the memory cell. The type of each film configuring the insulating film ONO (106, 107, 108) can also be appropriately varied.

Figure 16:
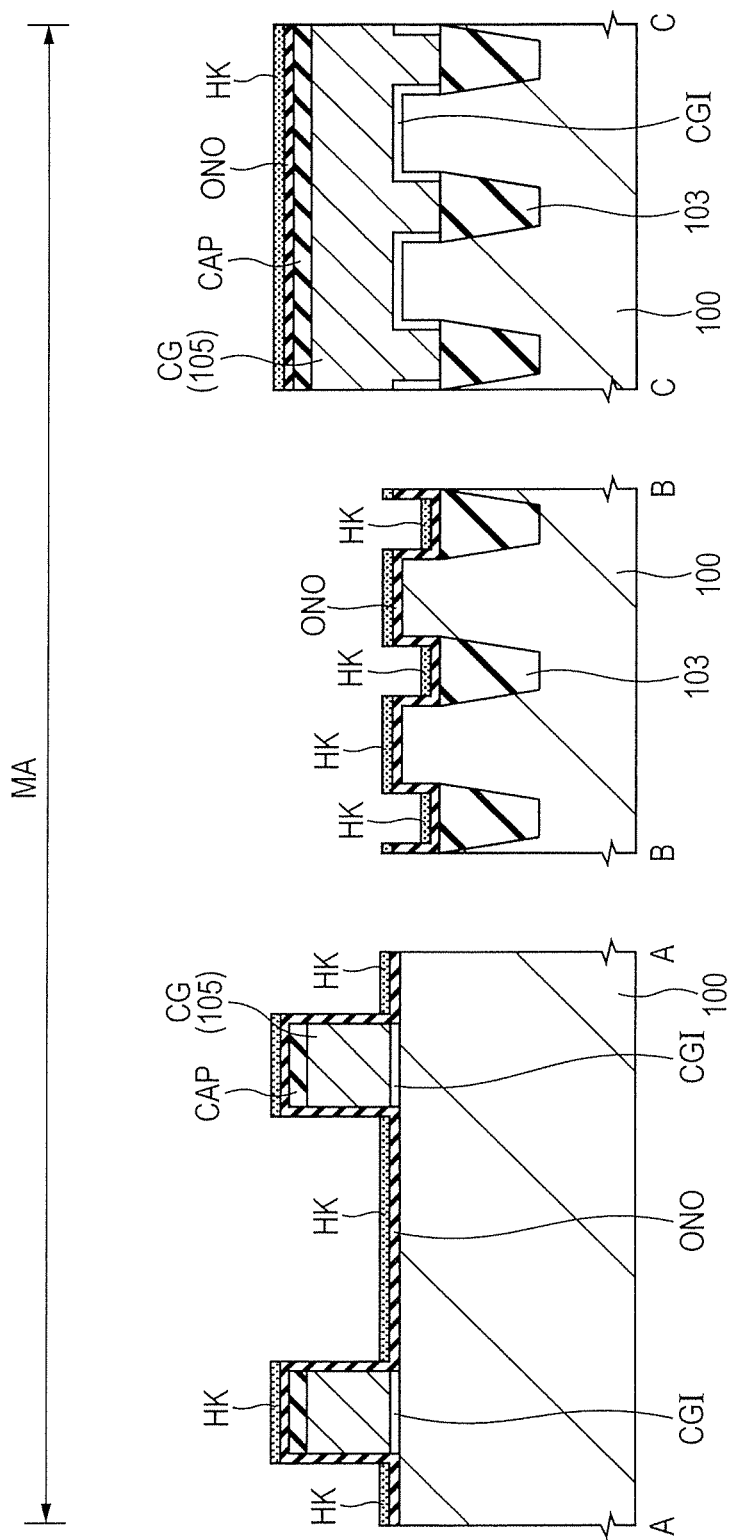
FIG. 16 includes sectional views illustrating the manufacturing process of the semiconductor device of the first embodiment.
Figure 17:
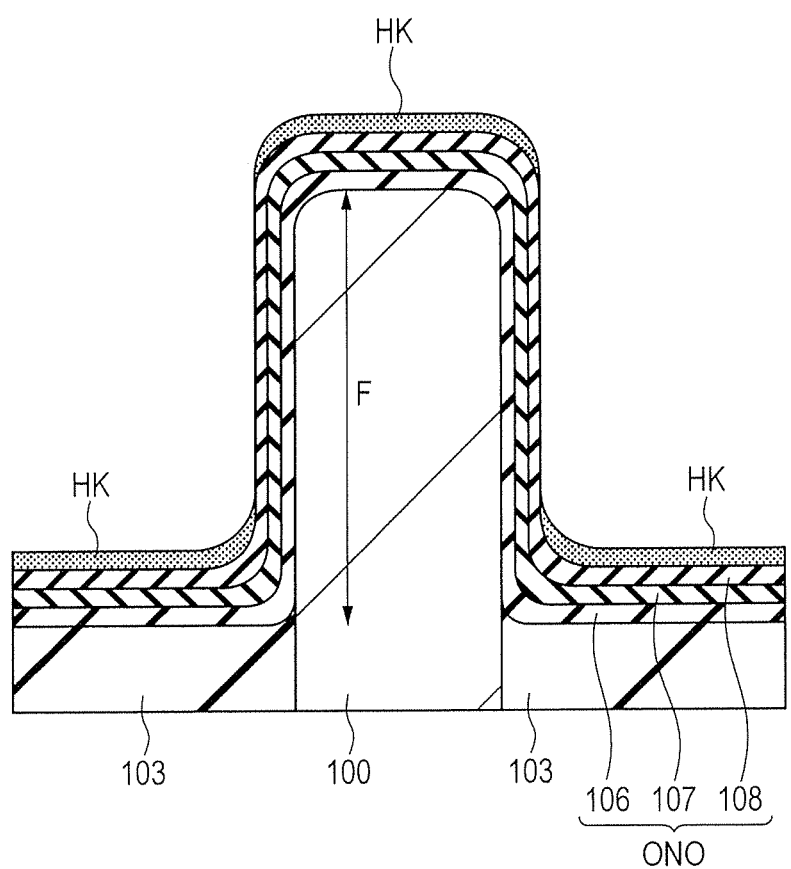
FIG. 17 is a sectional view illustrating the manufacturing process of the semiconductor device of the first embodiment.

Subsequently, as shown in FIGS. 16 and 17, the high dielectric constant film HK is formed on the insulating film ONO (106, 107, 108). For example, the high dielectric constant film HK is formed over the fin F (insulating film ONO) using a highly directional (highly anisotropic) film formation method. For example, the high dielectric constant film HK is formed using a sputtering process. Through such film formation, a thick film is deposited over the top of the fin F and the top of the element isolation region 103, each top being a flat portion, while a thin film is deposited over each side surface of the fin F (see FIG. 23).

Subsequently, the high dielectric constant film HK is isotropically etched to be removed by the thickness corresponding to the thin film deposited on the side surface of the fin F. As a result, the high dielectric constant film HK remains over the top of the fin F and the top of the element isolation region 103 while having a thickness corresponding to a thickness difference between the thick film and the thin film. That is, the high dielectric constant film HK remains only over the top of the fin F and the top of the element isolation region 103 while being not provided over the side surface of the fin F.

If the thickness of the high dielectric constant film HK is insufficient in this stage, the highly directional film formation and the isotropic etching are repeated.

Figure 18:
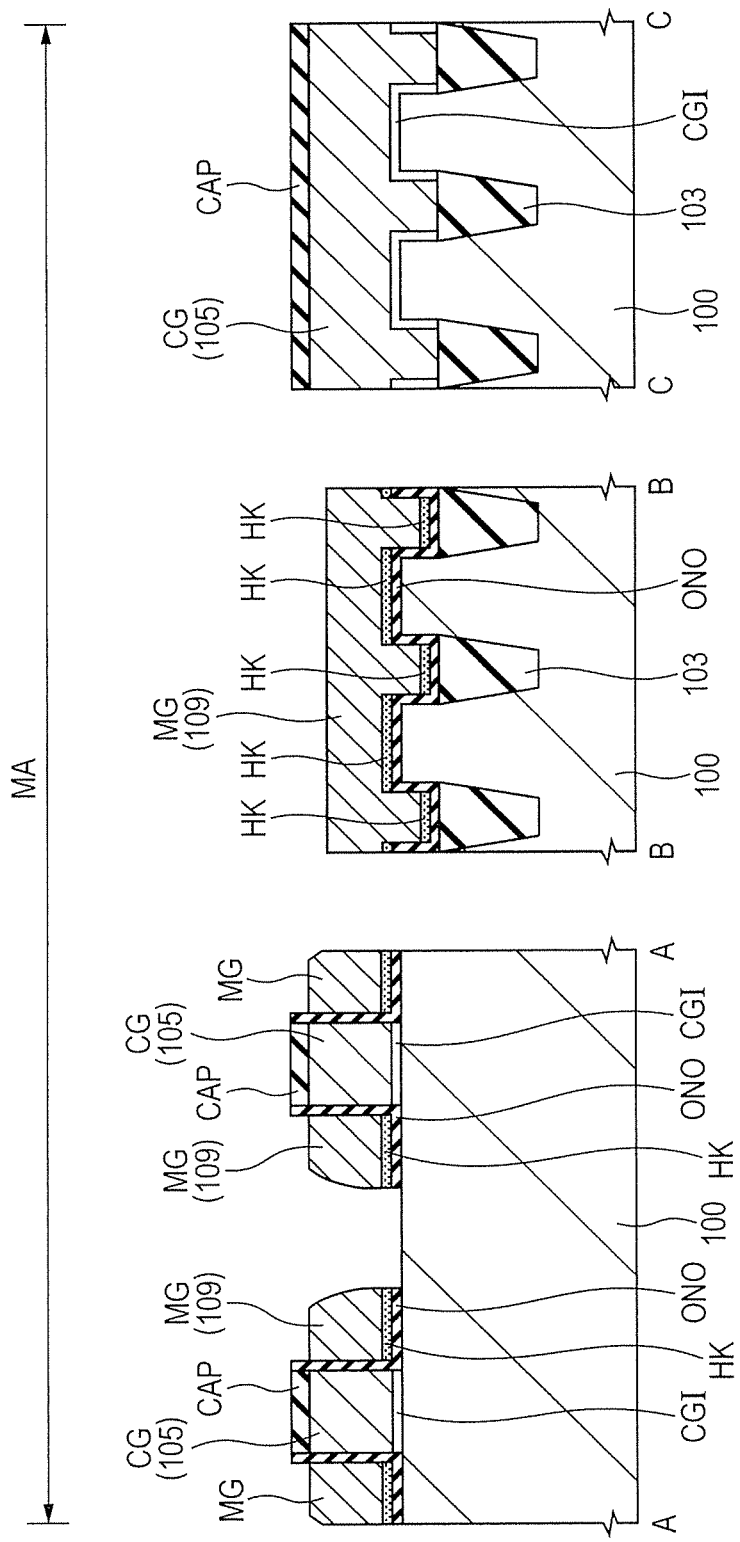
FIG. 18 includes sectional views illustrating the manufacturing process of the semiconductor device of the first embodiment.

Subsequently, as shown in FIG. 18, a conductive film 109 to be the memory gate electrode MG is formed over the insulating film ONO (106, 107, 108) and the high dielectric constant film HK. For example, a polysilicon film about 40 nm thick is deposited as the conductive film 109 by a CVD process or the like over the insulating film ONO (106, 107, 108) and the high dielectric constant film HK.

Subsequently, a sidewall-like memory gate electrode MG is formed over a sidewall portion of the control gate electrode CG.

For example, the polysilicon film is etched back. In this etch back step, the polysilicon film is removed by anisotropic dry etching by a predetermined thickness from its surface. Through this step, the polysilicon film can be left in a sidewall shape (sidewall film shape) over each sidewall portion of the control gate electrode CG with the insulating film ONO in between. The polysilicon film 109 remains on both sides of the control gate electrode CG, and the polysilicon film on one side serves as the memory gate electrode MG. The polysilicon film on the other side is removed using a photolithography technique and a dry etching technique. Subsequently, the insulating film ONO (106, 107, 108) and the like are etched with the memory gate electrode MG as a mask. As a result, the insulating film ONO (106, 107, 108) and the like remain between the memory gate electrode MG and the semiconductor substrate 100 (fin F) and between the control gate electrode CG and the memory gate electrode MG. Specifically, between the memory gate electrode MG and the semiconductor substrate 100 (fin F), the lamination film of the insulating film ONO (106, 107, 108) and the high dielectric constant film HK remains on the top portion of the fin F, the insulating film ONO (106, 107, 108) remains on each side surface portion of the fin F, and the insulating film ONO (106, 107, 108) remains between the control gate electrode CG and the memory gate electrode MG.

Figure 19:
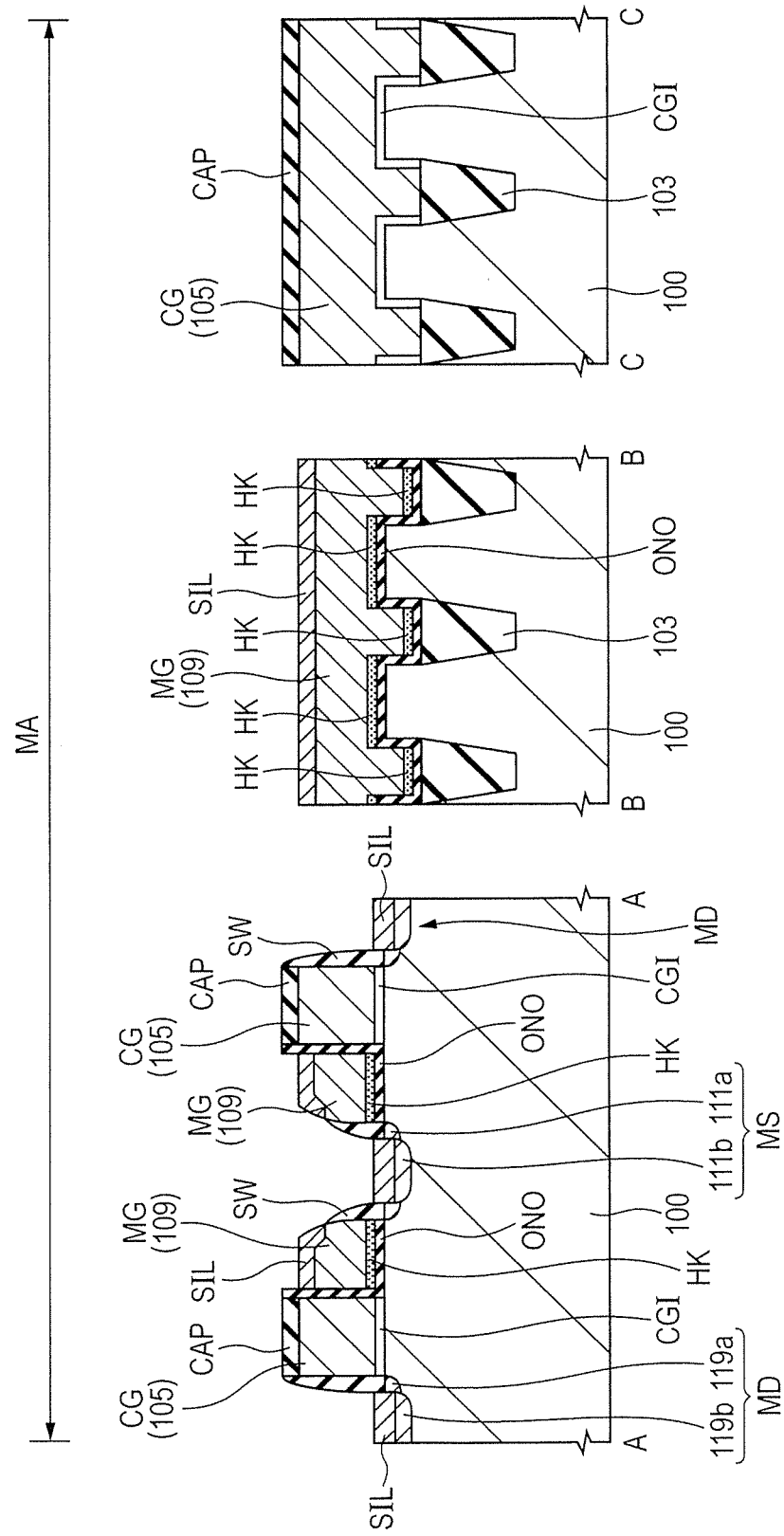
FIG. 19 includes sectional views illustrating the manufacturing process of the semiconductor device of the first embodiment.

Subsequently, as shown in FIG. 19, a source region MS and a drain region MD are formed in the memory cell region MA.

For example, an n-type impurity such as arsenic (As) or phosphorus (P) is implanted into the semiconductor substrate 100 (fin F) with the memory gate electrode MG and the control gate electrode CG as a mask, thereby the n$^-$-type semiconductor regions 111a and 119a are formed. At this time, the n$^-$-type semiconductor region 111a is formed so as to be self-aligned with a sidewall of the memory gate electrode MG. The n$^-$-type semiconductor region 119a is formed so as to be self-aligned with a sidewall of the control gate electrode CG.

Subsequently, the sidewall insulating film SW is formed on each of the sidewall portions of the memory gate electrode MG, the control gate electrode CG, and the gate electrode GE. For example, a silicon nitride film having a thickness of about 40 nm is deposited by a CVD process or the like over the semiconductor substrate 100 (fin F) including the memory gate electrode MG and the control gate electrode CG. The silicon nitride film is removed by anisotropic dry etching by a predetermined thickness from its surface, thereby the sidewall insulating film SW is formed. Subsequently, an n-type impurity such as arsenic (As) or phosphorus (P) is implanted into the semiconductor substrate 100 (fin F) with a mask including the memory gate electrode MG, the control gate electrode CG, the gate electrode GE, and the sidewall insulating films SW, thereby the n$^+$-type semiconductor regions 111b and 119b are formed. At this time, the n$^+$-type semiconductor regions 111b and 119b are each formed so as to be self-aligned with the sidewall insulating film SW. The n$^+$-type semiconductor region 111b has a higher impurity concentration and a deeper junction depth than the n$^-$-type semiconductor region 111a. The n$^+$-type semiconductor region 119b has a higher impurity concentration and a deeper junction depth than the n$^-$-type semiconductor region 119a. Through this step, the source region MS including the n$^-$-type semiconductor region 111a and the n$^+$-type semiconductor region 111b is formed, and the drain region MD including the n$^-$-type semiconductor region 119a and the n$^+$-type semiconductor region 119b is formed.

Subsequently, a metal silicide film SIL is formed on each of the memory gate electrode MG, the source region MS, and the drain region MD using a salicide technique.

For example, an undepicted metal film is formed over the memory gate electrode MG, the source region MS, and the drain region MD, and the semiconductor substrate 100 (fin F) is subjected to heat treatment to react the memory gate electrode MG, the source region MS, and the drain region MD with the metal film. As a result, the metal silicide film SIL is formed. The metal film is made of, for example, nickel (Ni) or a nickel-platinum (Pt) alloy, and can be formed by a sputtering process or the like. Subsequently, the unreacted metal film is removed. The metal silicide film SIL can reduce the diffusion resistance or the contact resistance.

Subsequently, a silicon oxide film is deposited as the interlayer insulating film IL1 by a CVD process or the like over the control gate electrode CG, the memory gate electrode MG, the gate electrode GE, and the like. Subsequently, the plugs P1 are formed in the silicon oxide film, and a wiring M1 is formed on each plug P1. The plug P1 can be formed, for example, by embedding a conductive film in a contact hole in the interlayer insulating film IL1. The wiring M1 can be formed, for example, by embedding a conductive film in a wiring trench in the interlayer insulating film IL2. Subsequently, the interlayer insulating films IL3 and IL4, the plugs P2, and the wirings M2 can be formed by repeating the steps of forming the interlayer insulating film, the plug, and the wiring (see FIGS. 1 and 2).

The semiconductor device of the first embodiment can be formed through the above-described steps.

(Application Example)

Figure 20:
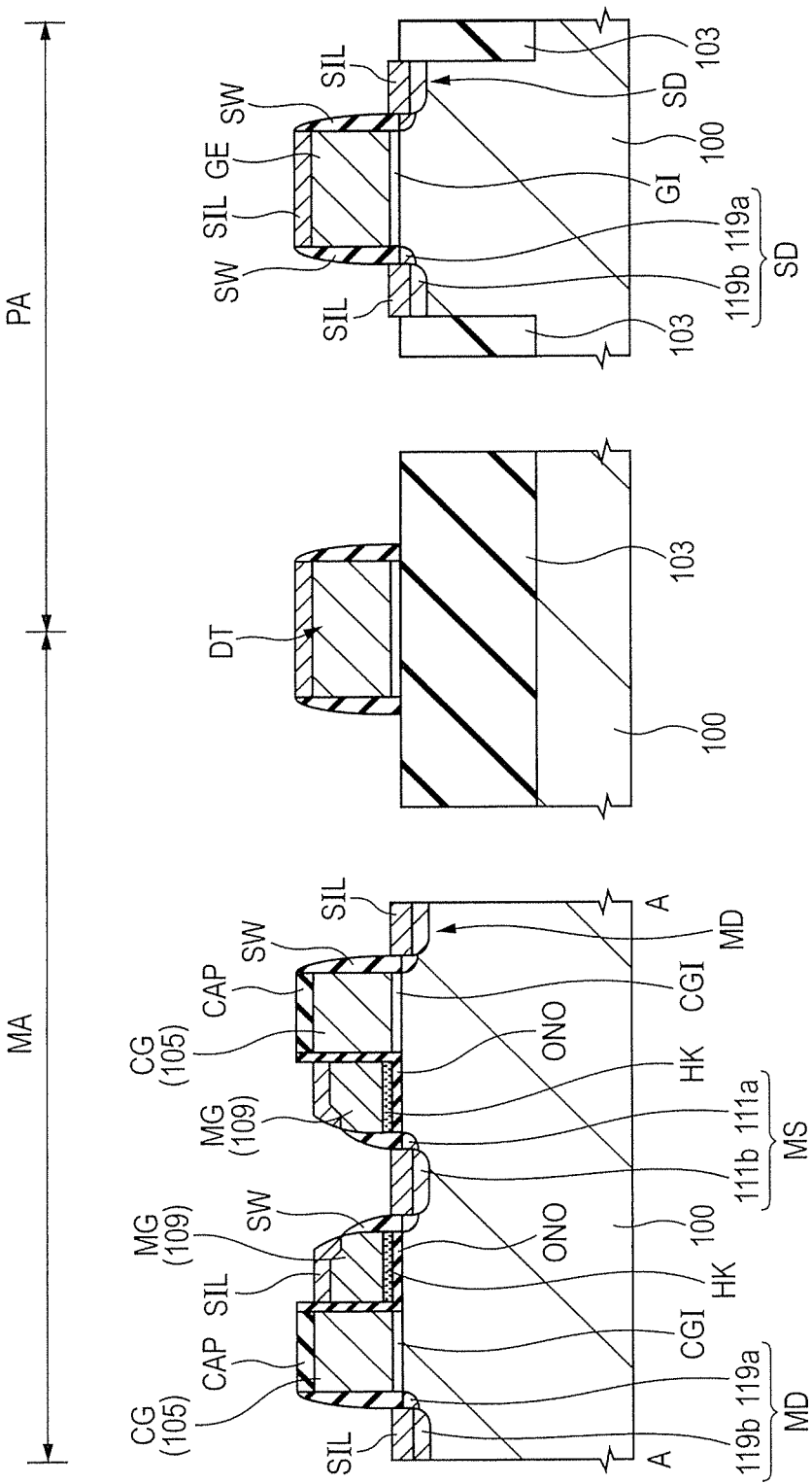
FIG. 20 includes sectional views illustrating a configuration a semiconductor device of an application example of the first embodiment.

Although only the memory cell region MA having the memory cells is illustrated for the semiconductor device of the first embodiment shown in FIG. 1, a peripheral circuit region PA is disposed in the vicinity of the memory cell region MA. FIG. 20 includes sectional views illustrating a configuration of a semiconductor device of an application example of the first embodiment.

As shown in FIG. 20, the memory cell as a nonvolatile memory is provided in the memory cell region MA as described above. MISFET is provided in the peripheral circuit region PA. Although the MISFET having a structure other than the FIN structure is provided in the peripheral circuit region PA in this description, the MISFET having the FIN structure may be provided in the peripheral circuit region PA.

As shown in FIG. 20, the MISFET in the peripheral circuit region PA includes a gate electrode (gate electrode portion) GE disposed over the semiconductor substrate 100, and source-and-drain regions SD provided in the semiconductor substrate 100 on both sides of the gate electrode GE. For example, the film in the same layer as the control gate electrode CG can be used as the gate electrode GE. The MISFET has a gate insulating film GI disposed between the gate electrode GE and the semiconductor substrate 100. For example, a silicon oxide film can be used as the gate insulating film GI. The film in the same layer as the control gate insulating film CGI may be used as the gate insulating film GI.

The sidewall insulating film SW including an insulating film is provided on each sidewall portion of the gate electrode GE. The source-and-drain region SD includes the n$^+$-type semiconductor region 119b and the n$^-$-type semiconductor region 119a. The n$^-$-type semiconductor region 119a is formed in a self-aligned manner with a sidewall of the gate electrode GE. The n$^+$-type semiconductor region 119b is formed in a self-aligned manner with a side surface of the sidewall insulating film SW, and has a deeper junction depth and a higher impurity concentration than the n$^-$-type semiconductor region 119a. A metal silicide film SIL is provided on the source-and-drain region SD (n$^+$-type semiconductor region 119b). A metal silicide film SIL is also provided on the gate electrode GE.

While not shown in FIG. 20, the interlayer insulating films (IL1, IL2, IL3, IL4) are provided on the MISFET, and the plugs P1 and P2 and the wirings M1 and M2 are provided in or on the interlayer insulating films as with the memory cell.

As shown in FIG. 20, a dummy transistor may be provided on the element isolation region 103 in a boundary region between the memory cell region MA and the peripheral circuit region PA.

The dummy transistor has a structural part similar to that of the MISFET in the peripheral circuit region PA. For example, the dummy transistor has a gate electrode, a gate insulating film, a sidewall insulating film, and a metal silicide film SIL on the gate electrode. The same structural part as that of the memory cell may be provided as the dummy transistor. In this way, the dummy transistor is provided on the element isolation region 103, thereby a density variation of a pattern constituting the memory cell or the MISFET is reduced in the boundary region between the memory cell region MA and the peripheral circuit region PA, and thus process variations can be reduced.

The MISFET can be formed by a typical manufacturing process. The same constituent parts as those of the memory cell, such as the gate insulating film, the gate electrode, and the source-and-drain region, can be formed by the same manufacturing steps as those of the memory cell.

Second Embodiment

Although the high dielectric constant film HK over the side surface of the fin F is removed for the semiconductor device of the first embodiment, the high dielectric constant film HK may be left over the side surface of the fin F. In such a case, the step of removing the high dielectric constant film HK can be omitted, and thus the manufacturing process can be simplified.

A structure of a semiconductor device of a second embodiment is now described with reference to the drawings. Since any configuration other than the shape of the high dielectric constant film HK is the same as that in the first embodiment, duplicated description is omitted.

Figure 21:
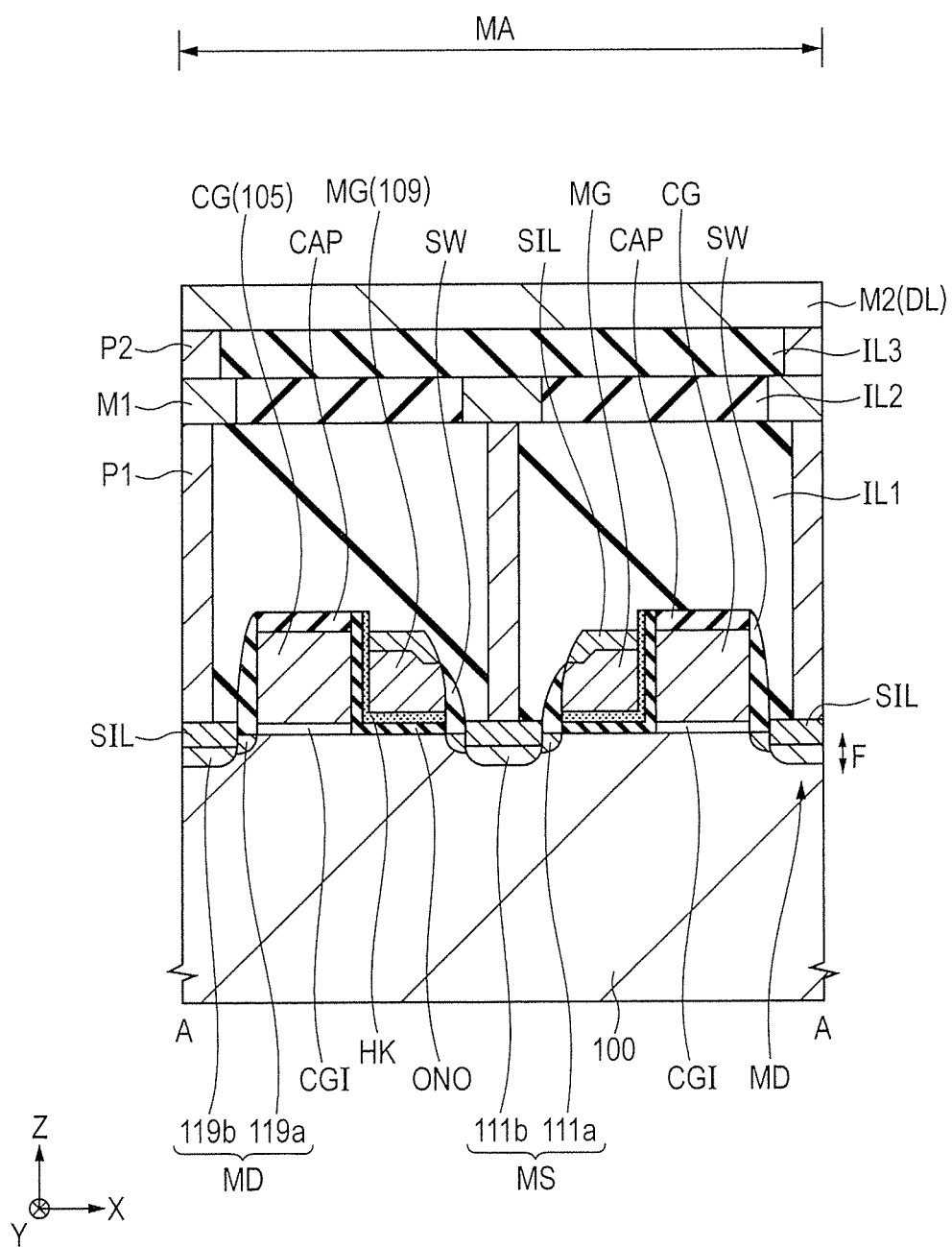
FIG. 21 is a sectional view illustrating a configuration of a semiconductor device of a second embodiment.
Figure 22:
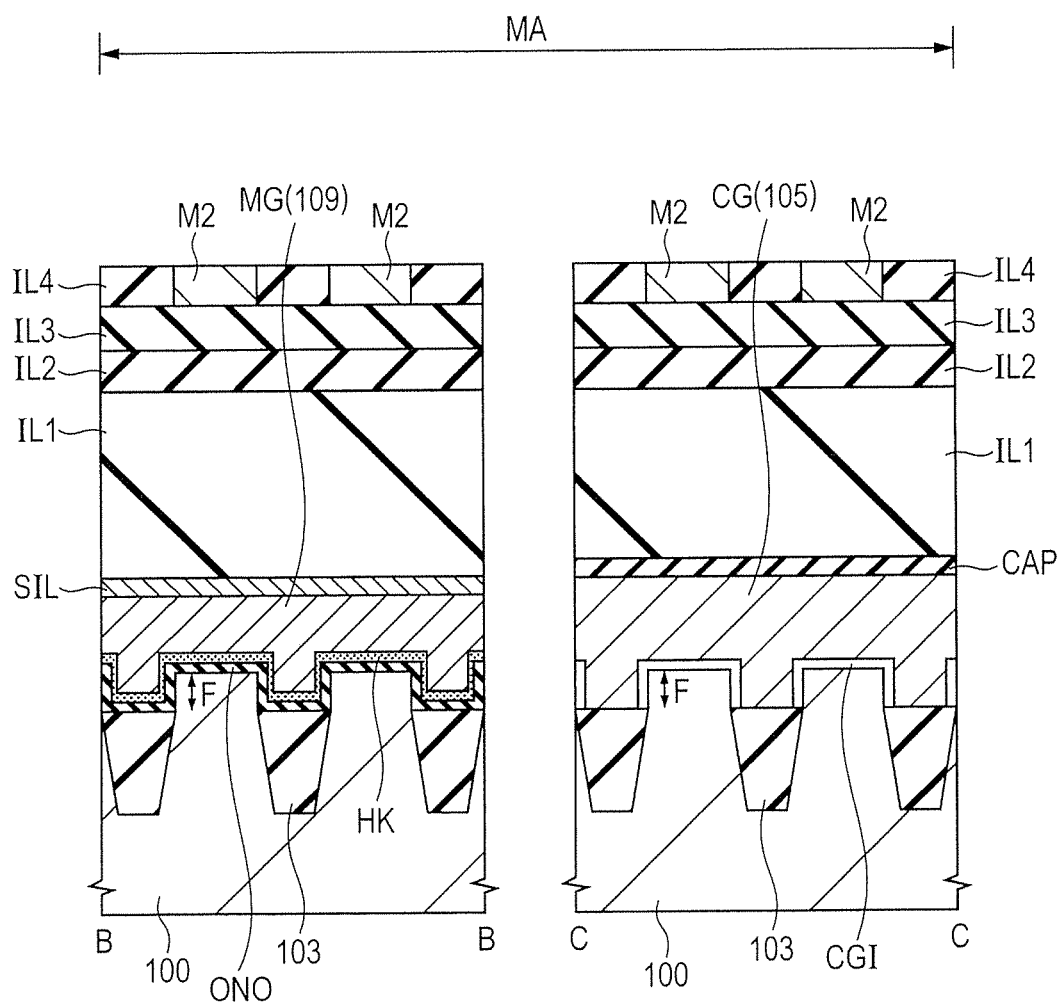
FIG. 22 includes sectional views illustrating the configuration of the semiconductor device of the second embodiment.

FIGS. 21 to 23 include sectional views illustrating the configuration of the semiconductor device of the second embodiment.

As shown in FIGS. 21 to 23, in the semiconductor device of the second embodiment, the high dielectric constant film HK is provided on the insulating film ONO, and has a large thickness over the top of the fin F and the top of the element isolation region 103, each top being a flat portion, while having a small thickness over each side surface of the fin F.

As described above, also in the second embodiment, since the high dielectric constant film HK is provided over the top of the fin F and the top of the element isolation region 103, it is possible to relax the electric field in the vicinity of each of the upper and lower corner portions of the fin F, leading to an improvement in disturbance characteristics. The high dielectric constant film HK over the side surface of the fin F is relatively thin, making it possible to reduce influence of the high dielectric constant film HK on memory operation at the side surface of the fin F.

Examples of a method for forming the high dielectric constant film HK includes the following method. A highly directional (highly anisotropic) film formation method is used for forming the high dielectric constant film HK over the fin F with the insulating film ONO in between. The highly directional film formation method includes a sputtering process. In a method for enhancing the directivity of the film, a bias potential is applied to a semiconductor substrate on which the film is to be formed, or a collimator is used. A highly directional CVD process may also be used.

Figure 24:
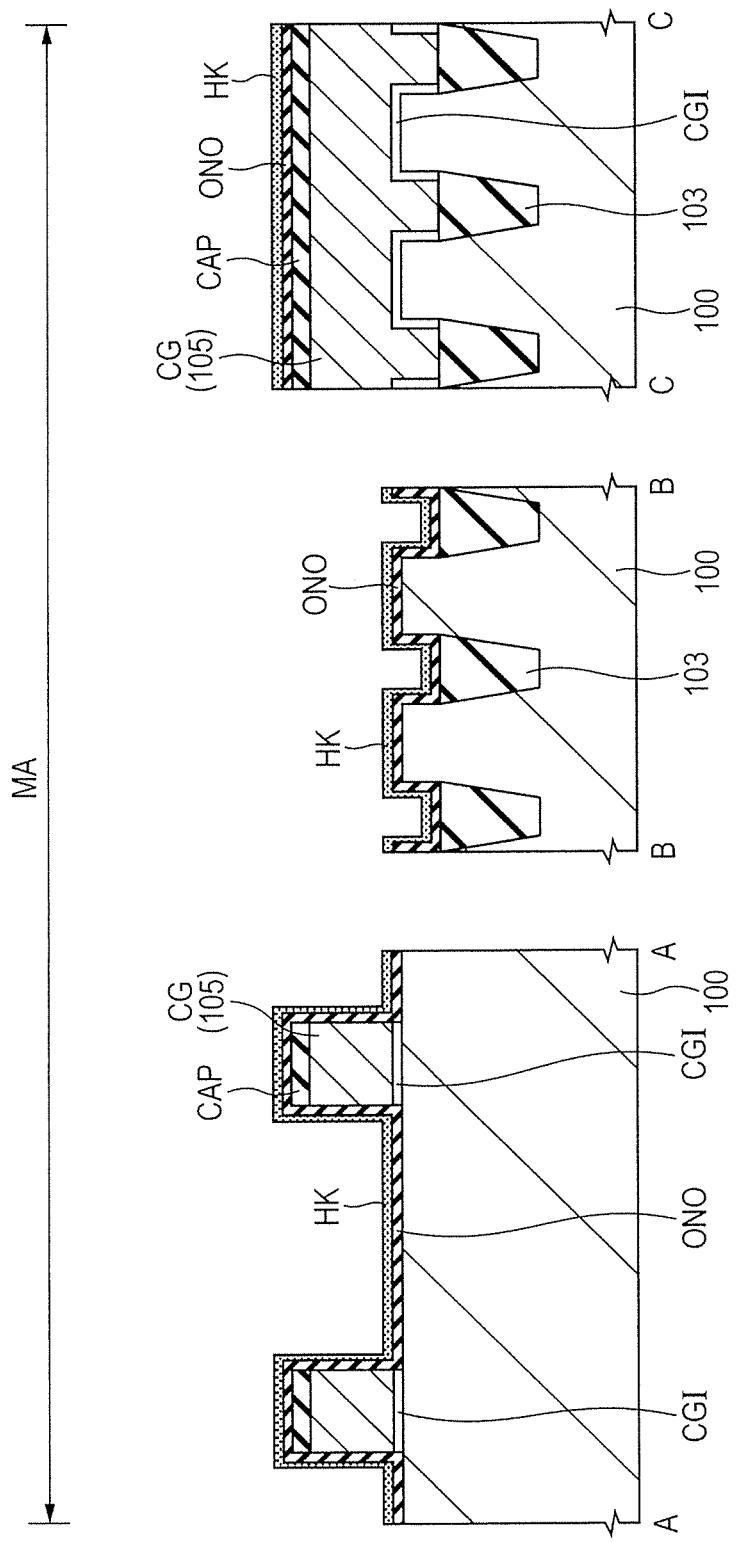
FIG. 24 includes sectional views illustrating a manufacturing process of the semiconductor device of the second embodiment.
Figure 25:
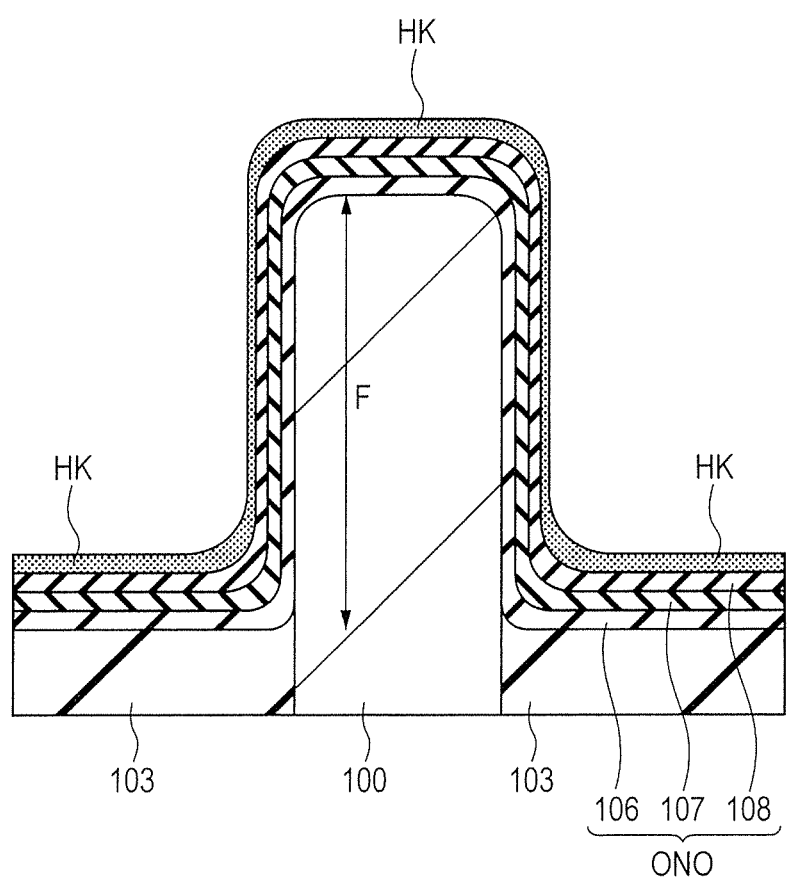
FIG. 25 is a sectional view illustrating the manufacturing process of the semiconductor device of the second embodiment.

FIGS. 24 and 25 include sectional views illustrating a manufacturing process of the semiconductor device of the second embodiment. The steps up to the step of forming the insulating film ONO (106, 107, 108) shown in FIGS. 24 and 25 are the same as those in the first embodiment.

Subsequently, the high dielectric constant film HK is formed on the insulating film ONO (106, 107, 108). For example, the high dielectric constant film HK is formed over the fin F (insulating film ONO) using a highly directional (highly anisotropic) film formation method. For example, the high dielectric constant film HK is formed using a sputtering process. Through such film formation, a thick film is deposited over the top of the fin F and the top of the element isolation region 103, each top being a flat portion, while a thin film is deposited over each side surface of the fin F. In this case, a thin film is also deposited over each side surface of the control gate electrode CG (see FIG. 24). The thick film over the top of the fin F has a thickness t1, and the thin film over the side surface of the fin F has a thickness t2, where t1>t2 is given. The thick film over the top of the element isolation region 103 has a thickness t3, where t3>t2 is given. It can be defined that the thickness t1 is a thickness at the middle of the top of the fin F, the thickness t2 is a thickness at the middle of the side surface of the fin F, and the thickness t3 is a thickness at the middle of the element isolation region 103.

The thickness (t2) of the thin film is preferably as small as possible, but is allowed to be up to about ⅓ of the thickness (t1 or t3) of the thick film. In addition, the thickness (t2) of the thin film is allowed to be up to about 10 nm. In other words, the thickness of the thin film is preferably equal to or smaller than ⅓ of the thickness (t1 or t3) of the thick film. In addition, the thickness of the thin film is preferably 10 nm or less.

Thereafter, the semiconductor device can be manufactured in the same manner as in the first embodiment, such as formation of the conductive film (109) to be the memory gate electrode MG over the insulating film ONO (106, 107, 108) and the high dielectric constant film HK.

Third Embodiment

Although the semiconductor device of the first embodiment is exemplarily described with the dual gate cell (split gate cell), in which a unit cell has the memory gate electrode MG and the control gate electrode CG, the high dielectric constant film HK may be applied to a single gate cell having only the memory gate electrode MG.

A structure of a semiconductor device of a third embodiment is now described with reference to the drawings. The same constitutional parts as those in the first embodiment are designated by the same reference numerals, and duplicated description is omitted.

Figure 26:
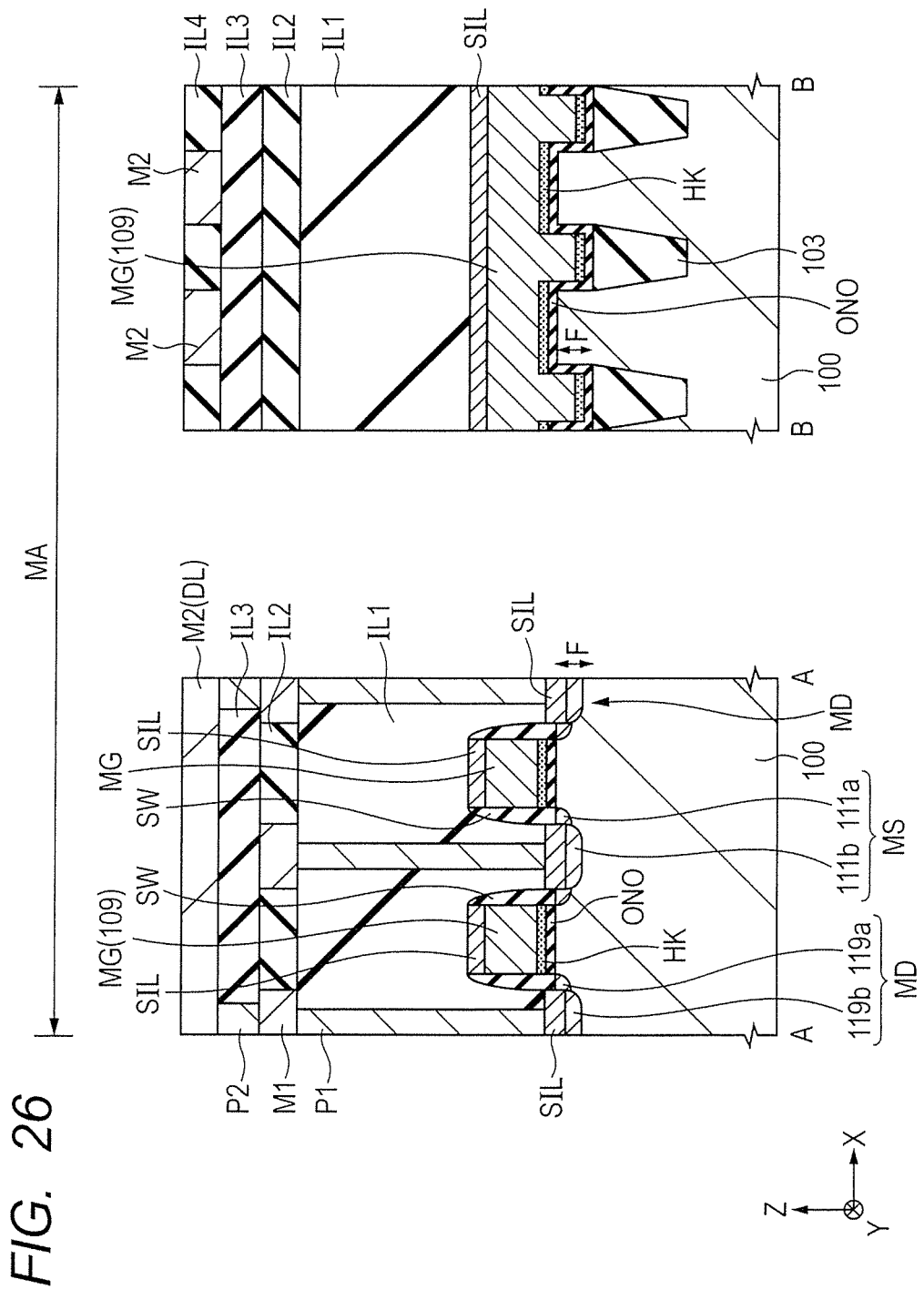
FIG. 26 includes sectional views illustrating a configuration of a semiconductor device of a third embodiment.
Figure 27:
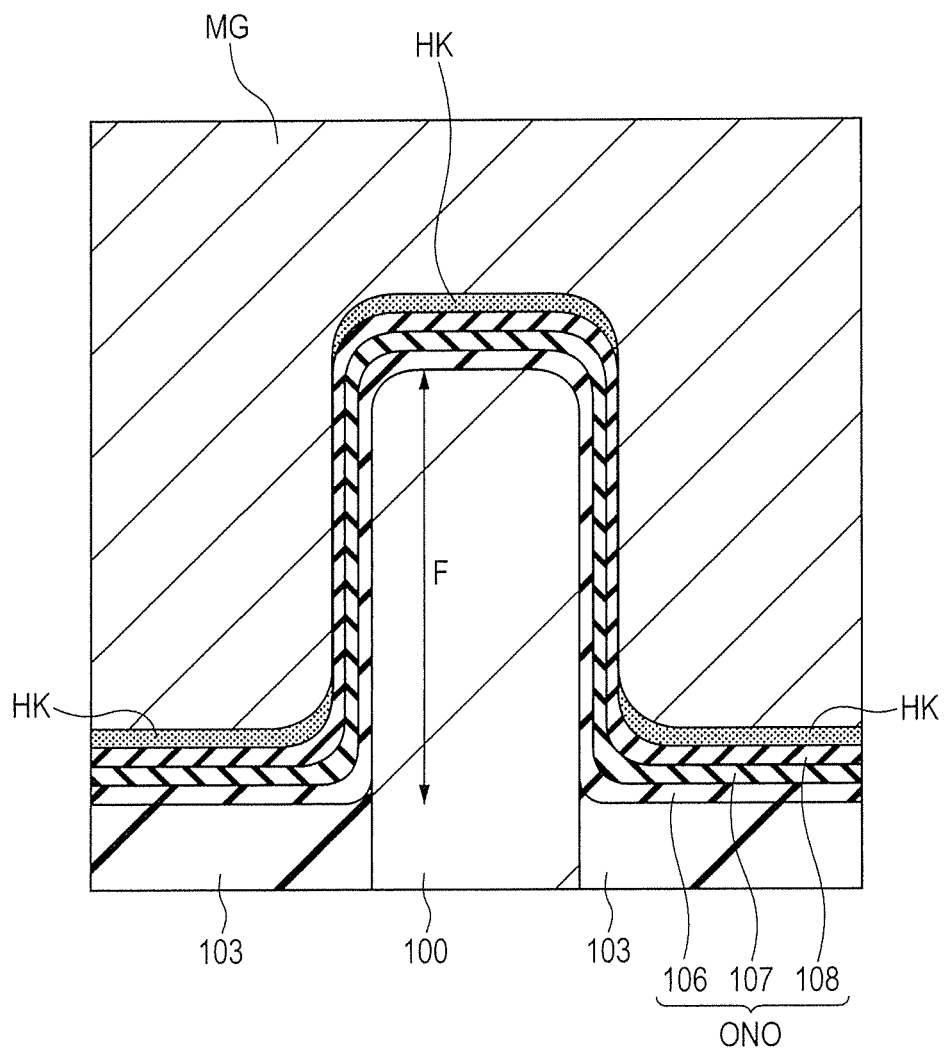
FIG. 27 is a sectional view illustrating the configuration of the semiconductor device of the third embodiment.
Figure 28:
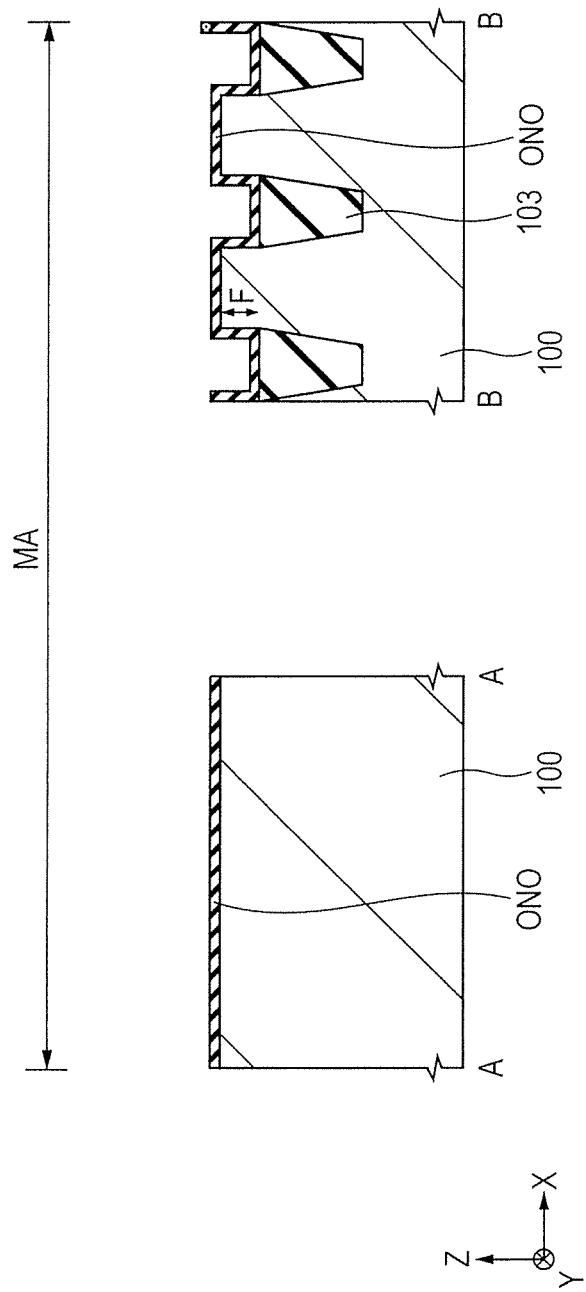
FIG. 28 includes sectional views illustrating a manufacturing process of the semiconductor device of the third embodiment.

FIGS. 26 and 27 include sectional views illustrating a configuration of the semiconductor device of the third embodiment. As shown in the drawings, the memory cell includes a memory transistor having the memory gate electrode MG, but does not include the control gate electrode CG unlike the memory cell (FIG. 1) of the first embodiment.

Specifically, the memory cell has the memory gate electrode MG disposed over the semiconductor substrate 100 (fin F). For example, the memory gate electrode MG includes a silicon film.

In the third embodiment, the memory gate electrode MG is disposed over the fin F with the insulating film ONO in between. The fin F is configured of an upper portion of the semiconductor substrate 100. The fin F has a linear planar shape (having a long side in the X direction) having a certain width (length in the Y direction) (see FIG. 4). For example, as in the first embodiment, four fins F are arranged with a certain interval (pitch) in the Y direction. A region between the fins F corresponds to the element isolation region 103. The memory gate electrode MG extends in the Y direction.

The insulating film ONO (106, 107, 108) exists between the memory gate electrode MG and the semiconductor substrate 100 (fin F). The insulating film ONO includes, for example, the lower insulating film 106, the middle insulating film 107 on the lower insulating film 106, and the upper insulating film 108 on the middle insulating film 107 (see FIG. 27). The middle insulating film 107 serves as a charge storage part. The lower insulating film 106 includes, for example, a silicon oxide film. The middle insulating film 107 includes, for example, a silicon nitride film. The upper insulating film 108 includes, for example, a silicon oxynitride film.

In the third embodiment, the high dielectric constant film HK is provided on the insulating film ONO. The high dielectric constant film HK is disposed on the insulating film ONO over the top of the fin F and the top of the element isolation region 103, but is not disposed over each side surface of the fin F (see FIG. 27).

The memory cell further includes the drain region MD and the source region MS formed in the fin F of the semiconductor substrate 100. The sidewall insulating film (sidewall, sidewall spacer) SW including an insulating film is provided on each sidewall portion of the memory gate electrode MG.

The drain region MD includes the n$^+$-type semiconductor region 119$b$ and the n$^-$ type semiconductor region 119$a$. The n$^-$ type semiconductor region 119$a$ is formed in a self-aligned manner with a sidewall of the memory gate electrode MG. The n$^+$-type semiconductor region 119$b$ is formed in a self-aligned manner with a side surface of the sidewall insulating film SW on the memory gate electrode MG, and has a deeper junction depth and a higher impurity concentration than the n$^-$-type semiconductor region 119$a$.

The source region MS includes the n$^+$-type semiconductor region 111$b$ and the n$^-$-type semiconductor region 111$a$. The n$^-$-type semiconductor region 111$a$ is formed in a self-aligned manner with a sidewall of the memory gate electrode MG. The n$^+$-type semiconductor region 111$b$ is formed in a self-aligned manner with a side surface of the sidewall insulating film SW on the memory gate electrode MG, and has a deeper junction depth and a higher impurity concentration than the n$^-$-type semiconductor region 111$a$.

A metal silicide film SIL is provided on the drain region MD (n$^+$-type semiconductor region 119$b$) and the source region MS (n$^+$-type semiconductor region 111$b$). A metal silicide film SIL is also provided on the memory gate electrode MG.

The interlayer insulating films IL1, IL2, IL3, and IL4 are provided on the memory cell. Such films include, for example, a silicon oxide film. The plugs P1 are provided in the interlayer insulating film IL1, and the wiring M1 is provided on each plug P1. The plugs P2 are provided in the interlayer insulating film IL3, and the wiring M2 is provided on each plug P2. The wirings M1 and M2 are, for example, embedded wirings and made of a conductive material such as metal. The wirings M1 and M2 are embedded in the interlayer insulating films IL2 and IL4, respectively.

As described above, also in the third embodiment, since the high dielectric constant film HK is provided over the top of the fin F and the top of the element isolation region 103, it is possible to relax the electric field in the vicinity of each of the upper and lower corner portions of the fin F, leading to an improvement in disturbance characteristics. In addition, since the high dielectric constant film HK is not provided over each side surface of the fin F, the memory operation at the side surface of the fin F is not blocked by the high dielectric constant film HK. Furthermore, erase/write endurance characteristics and retention characteristics can be improved by the high dielectric constant film HK.

FIGS. 28 to 34 include sectional views illustrating a manufacturing process of the semiconductor device of the third embodiment. First, as in the first embodiment, an element isolation trench is formed, and an insulating film such as a silicon oxide film is embedded in the element isolation trench, thereby the element isolation region 103 is formed (see FIG. 28).

Subsequently, the surface of each element isolation region 103 in the memory cell region MA is retracted. For example, the surface of the element isolation region 103 in the memory cell region MA is retracted by a certain amount by wet etching. The retraction amount is, for example, about 50 nm.

Consequently, in the memory cell region MA, an upper portion of the semiconductor substrate 100 between the element isolation regions 103 becomes a protrusion. Such a protrusion serves as the fin F (see FIG. 28).

Figure 29:
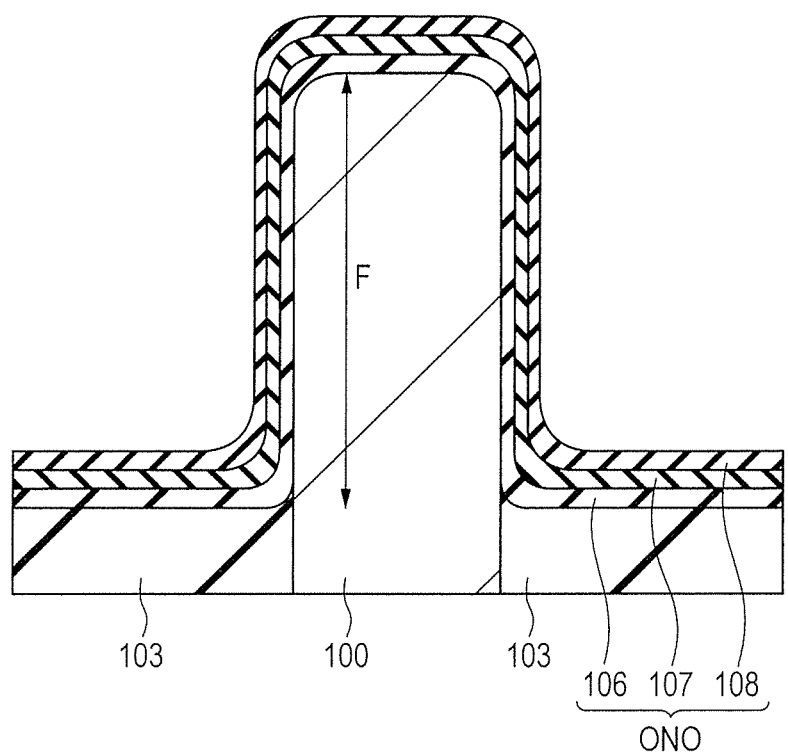
FIG. 29 is a sectional view illustrating the manufacturing process of the semiconductor device of the third embodiment.

Subsequently, the insulating film ONO (106, 107, 108) is formed on the semiconductor substrate 100 (fin F). First, as shown in FIG. 29, for example, a silicon oxide film is formed as the lower insulating film 106 on the semiconductor substrate 100 (fin F). The silicon oxide film is formed about 4 to 7 nm in thickness by a thermal oxidation process, for example. The silicon oxide film may be formed by a CVD process or the like. Subsequently, for example, a silicon nitride film as the middle insulating film 107 is deposited about 7 nm in thickness on the lower insulating film 106 by a CVD process or the like. The middle insulating film 107 serves as a charge storage part of the memory cell. Subsequently, for example, a silicon oxide film as the upper insulating film 108 is deposited about 9 nm in thickness on the middle insulating film 107 by a CVD process or the like. The thickness of each film configuring the insulating film ONO (106, 107, 108) can be appropriately varied depending on an operation method of the memory cell. The type of the film configuring the insulating film ONO (106, 107, 108) can also be appropriately varied.

Figure 30:
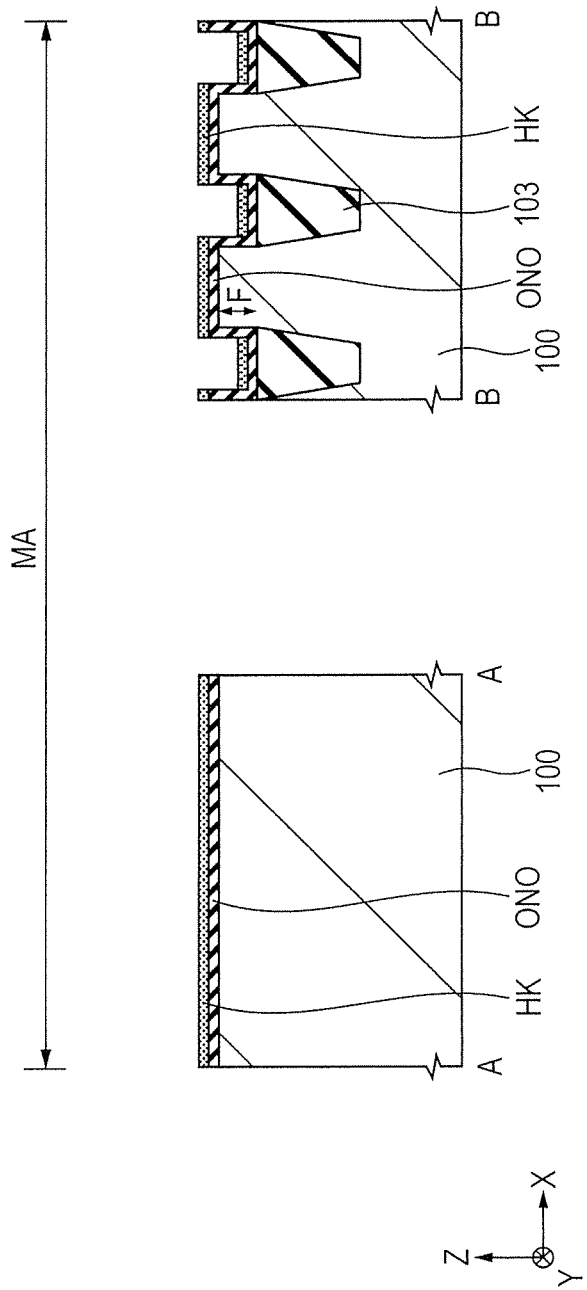
FIG. 30 includes sectional views illustrating the manufacturing process of the semiconductor device of the third embodiment.
Figure 31:
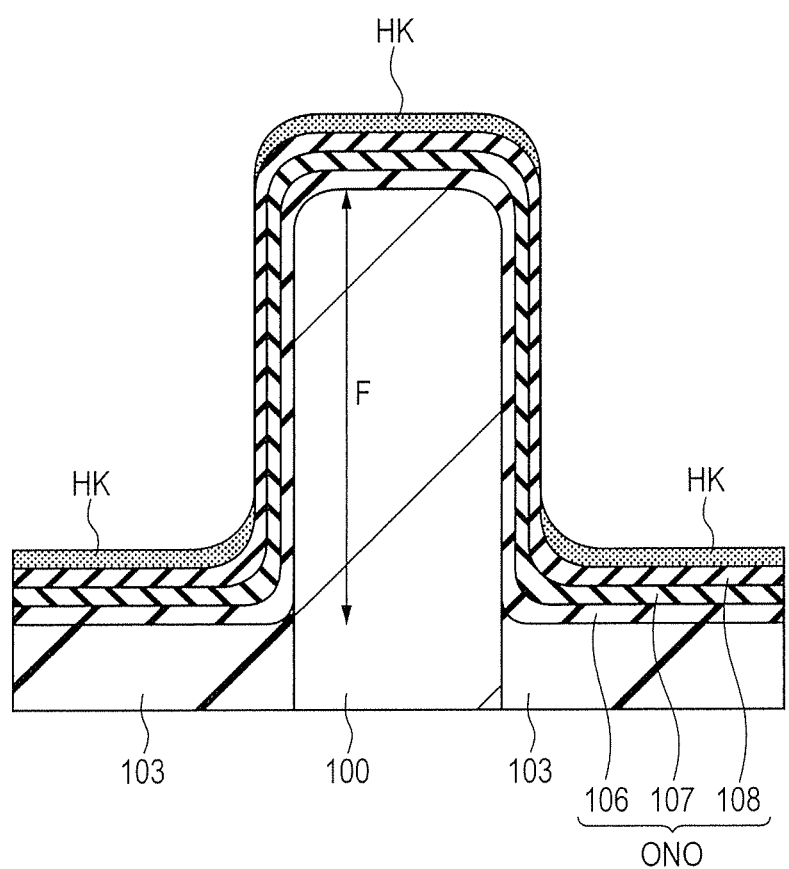
FIG. 31 is a sectional view illustrating the manufacturing process of the semiconductor device of the third embodiment.

Subsequently, as shown in FIGS. 30 and 31, the high dielectric constant film HK is formed on the insulating film ONO (106, 107, 108). For example, the high dielectric constant film HK is formed over the fin F (insulating film ONO) using a highly directional (highly anisotropic) film formation method. For example, the high dielectric constant film HK is formed using a sputtering process. Through such film formation, a thick film is deposited over the top of the fin F and the top of the element isolation region 103, each top being a flat portion, while a thin film is deposited over each side surface of the fin F.

Subsequently, the high dielectric constant film HK is isotropically etched to be removed by the thickness corresponding to the thin film. As a result, the high dielectric constant film HK remains over the top of the fin F and the top of the element isolation region 103 while having a thickness corresponding to a thickness difference between the thick film and the thin film. That is, the high dielectric constant film HK remains only over the top of the fin F and the top of the element isolation region 103 while being not provided over the side surface of the fin F.

If the thickness of the high dielectric constant film HK is insufficient in this stage, the highly directional film formation and the isotropic etching are repeated.

Figure 32:
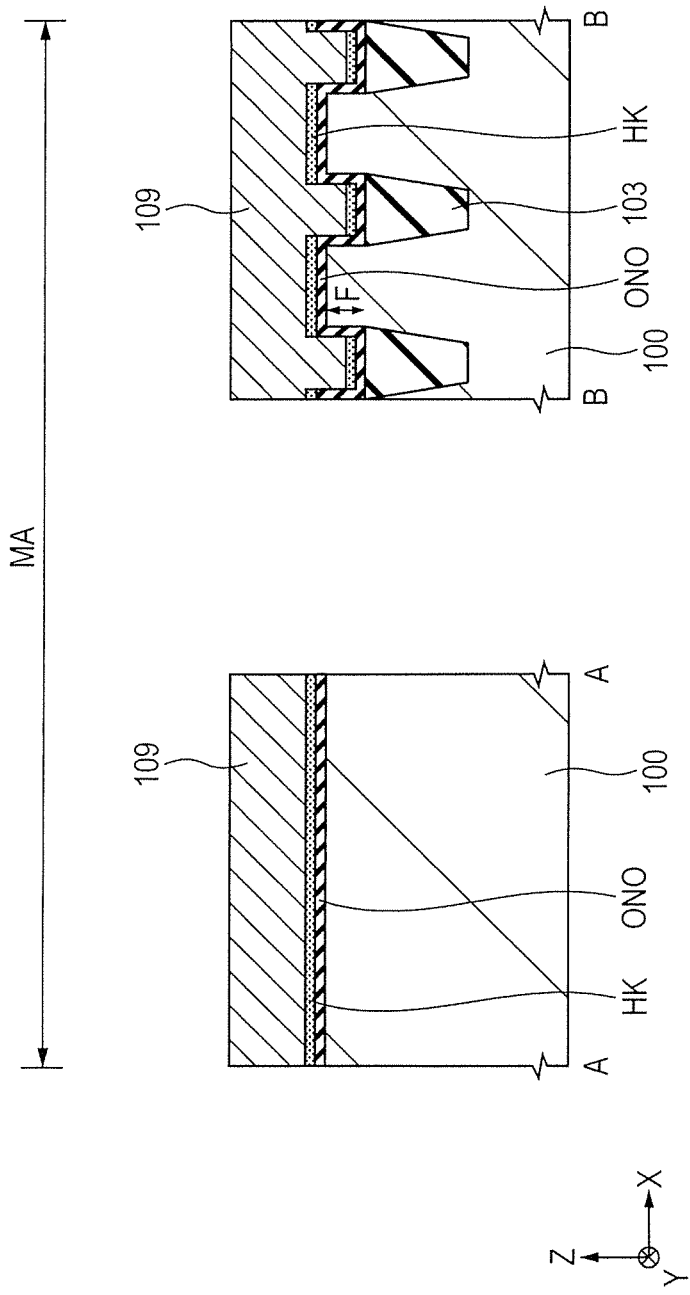
FIG. 32 includes sectional views illustrating the manufacturing process of the semiconductor device of the third embodiment.

Subsequently, as shown in FIG. 32, a conductive film 109 to be the memory gate electrode MG is formed over the insulating films ONO (166, 107, 108) and the high dielectric constant film HK. For example, a polysilicon film about 40 nm thick is deposited as the conductive film 109 by a CVD process or the like over the insulating film ONO (106, 107, 108) and the high dielectric constant film HK.

Figure 33:
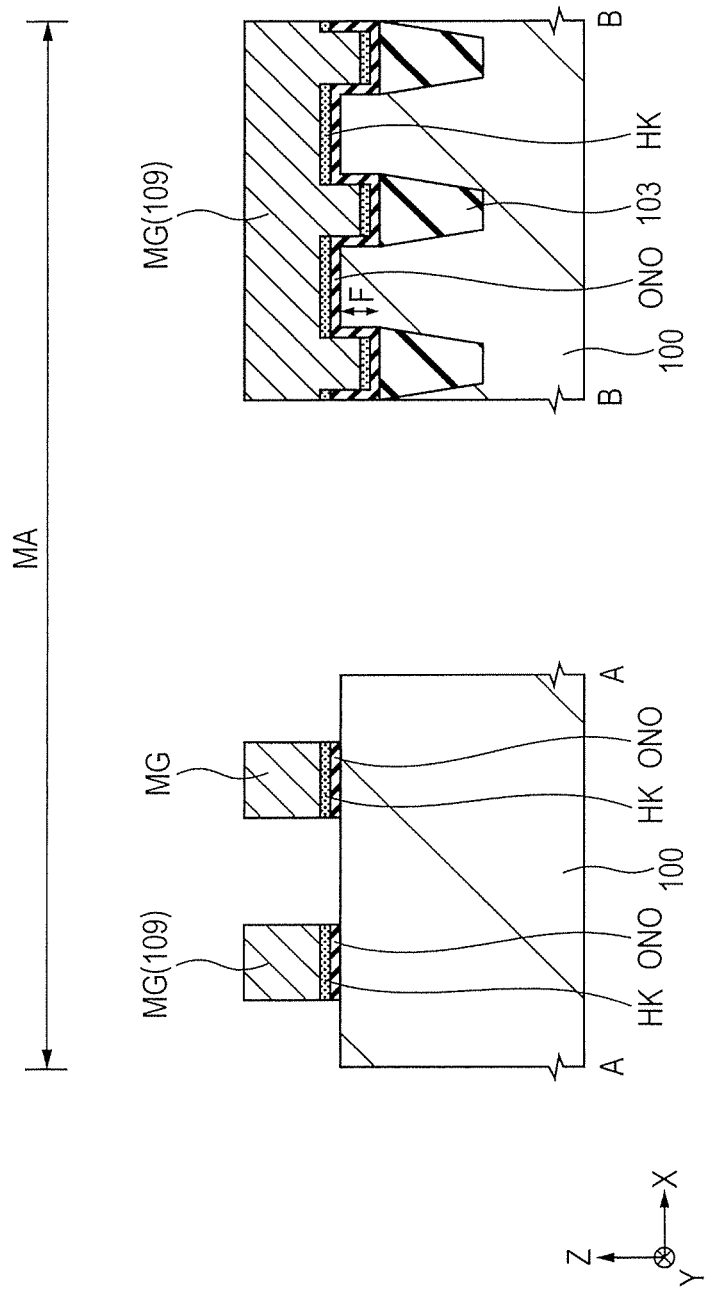
FIG. 33 includes sectional views illustrating the manufacturing process of the semiconductor device of the third embodiment.

Subsequently, as shown in FIG. 33, the lamination film of the insulating film ONO (106, 107, 108) and the polysilicon film 109 is patterned using a photolithography technique and a dry etching technique to form the memory gate electrode MG.

Figure 34:
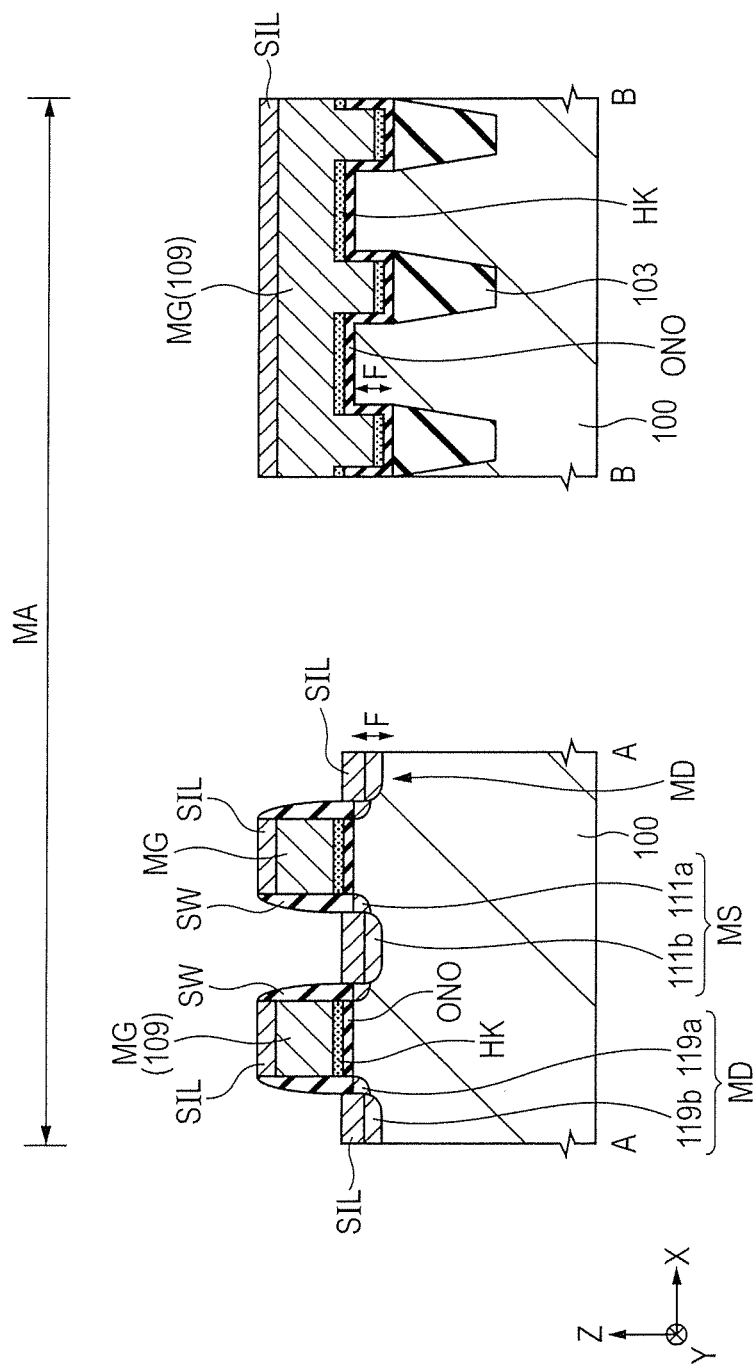
FIG. 34 includes sectional views illustrating the manufacturing process of the semiconductor device of the third embodiment.

Subsequently, as shown in FIG. 34, the source region MS and the drain region MD are formed in the memory cell region MA.

For example, an n-type impurity such as arsenic (As) or phosphorus (P) is implanted into the semiconductor substrate 100 (fin F) with the memory gate electrode MG as a mask, thereby the n⁻-type semiconductor regions 111a and 119a are formed. At this time, the n⁻-type semiconductor regions 111a and 119a are each formed so as to be self-aligned with a sidewall of the memory gate electrode MG.

Subsequently, the sidewall insulating film SW is formed on a sidewall portion of the memory gate electrode MG. For example, a silicon nitride film having a thickness of about 40 nm is deposited by a CVD process or the like over the semiconductor substrate 100 (fin F) including the memory gate electrode MG. The silicon nitride film is removed by anisotropic dry etching by a predetermined thickness from its surface, thereby the sidewall insulating film SW is formed. Subsequently, an n-type impurity such as arsenic (As) or phosphorus (P) is implanted into the semiconductor substrate 100 (fin F) using a mask including the memory gate electrode MG and the sidewall insulating films SW, thereby the n⁺-type semiconductor regions 111b and 119b are formed. At this time, the n⁺-type semiconductor regions 111b and 119b are each formed so as to be self-aligned with the sidewall insulating film SW. The n⁺-type semiconductor region 111b has a higher impurity concentration and a deeper junction depth than the n⁻-type semiconductor region 111a. The n⁺-type semiconductor region 119b has a higher impurity concentration and a deeper junction depth than the n⁻-type semiconductor region 119a. Through this step, the source region MS including the n⁻-type semiconductor region 111a and the n⁺-type semiconductor region 111b is formed, and the drain region MD including the n⁻-type semiconductor region 119a and the n⁺-type semiconductor region 119b is formed.

Subsequently, the metal silicide film SIL is formed on each of the memory gate electrode MG, the source region MS, and the drain region MD using a salicide technique.

Subsequently, a silicon oxide film is deposited as the interlayer insulating film IL1 by a CVD process or the like over the memory gate electrode MG. Subsequently, the plugs P1 are formed in the silicon oxide film, and the wiring M1 is formed on each plug P1. The plug P1 can be formed, for example, by embedding a conductive film in a contact hole in the interlayer insulating film IL1. The wiring M1 can be formed, for example, by embedding a conductive film in a wiring trench in the interlayer insulating film IL2. Subsequently, the interlayer insulating films IL3 and IL4, the plugs P2, and the wirings M2 can be formed by repeating the steps of forming the interlayer insulating film, the plug, and the wiring (see FIG. 26).

The semiconductor device of the third embodiment can be formed through the above-described steps.

Fourth Embodiment

Although the high dielectric constant film HK over the side surface of the fin F is removed for the semiconductor device of the third embodiment, the high dielectric constant film HK may be left over the side surface of the fin F. In such a case, the step of removing the high dielectric constant film HK can be omitted, and thus the manufacturing process can be simplified.

A structure of a semiconductor device of a fourth embodiment is now described with reference to the drawings. Since the configuration other than the shape of the high dielectric constant film HK is the same as that in the third embodiment, duplicated description is omitted.

Figure 35:
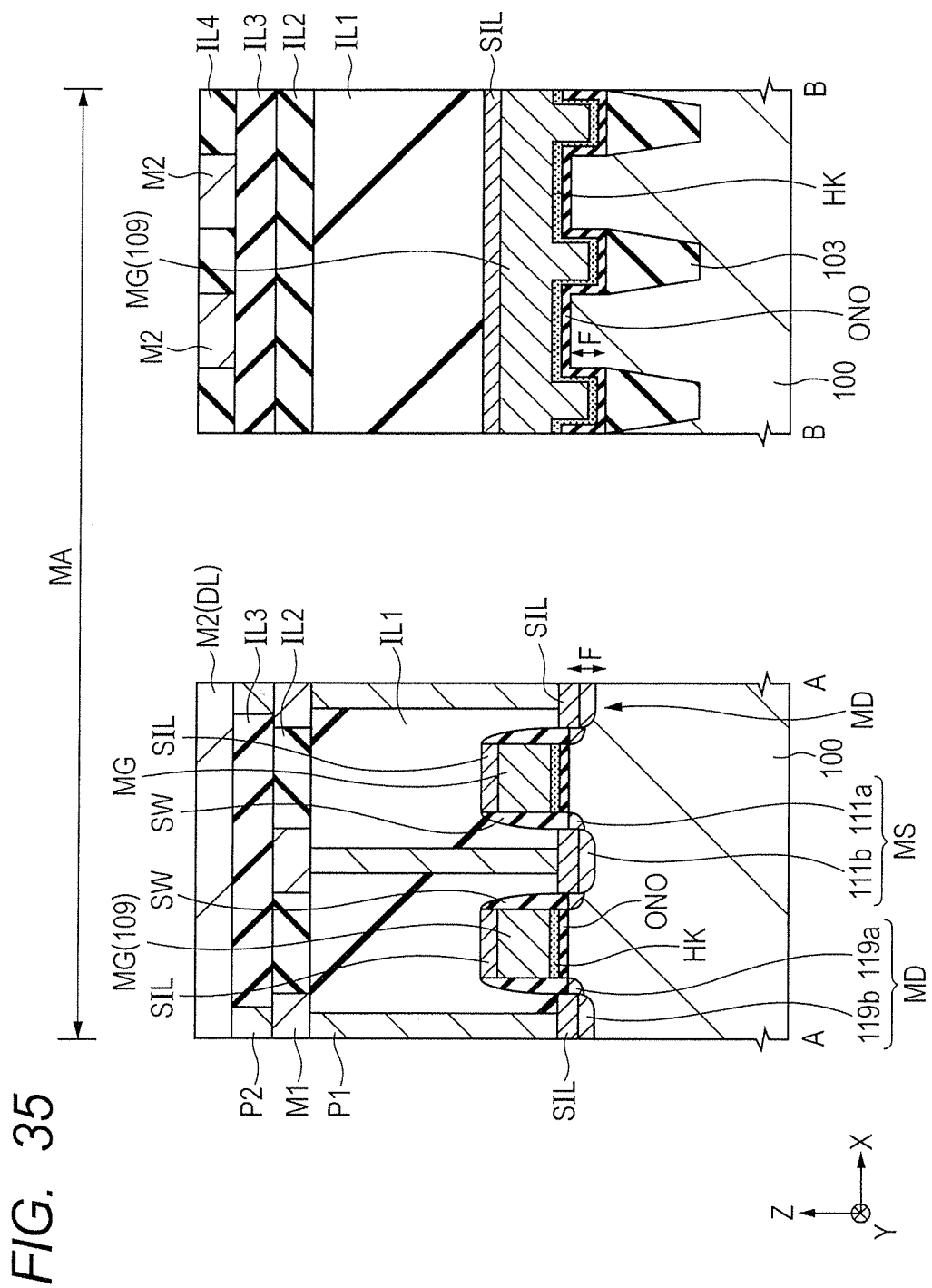
FIG. 35 includes sectional views illustrating a configuration of a semiconductor device of a fourth embodiment.
Figure 36:
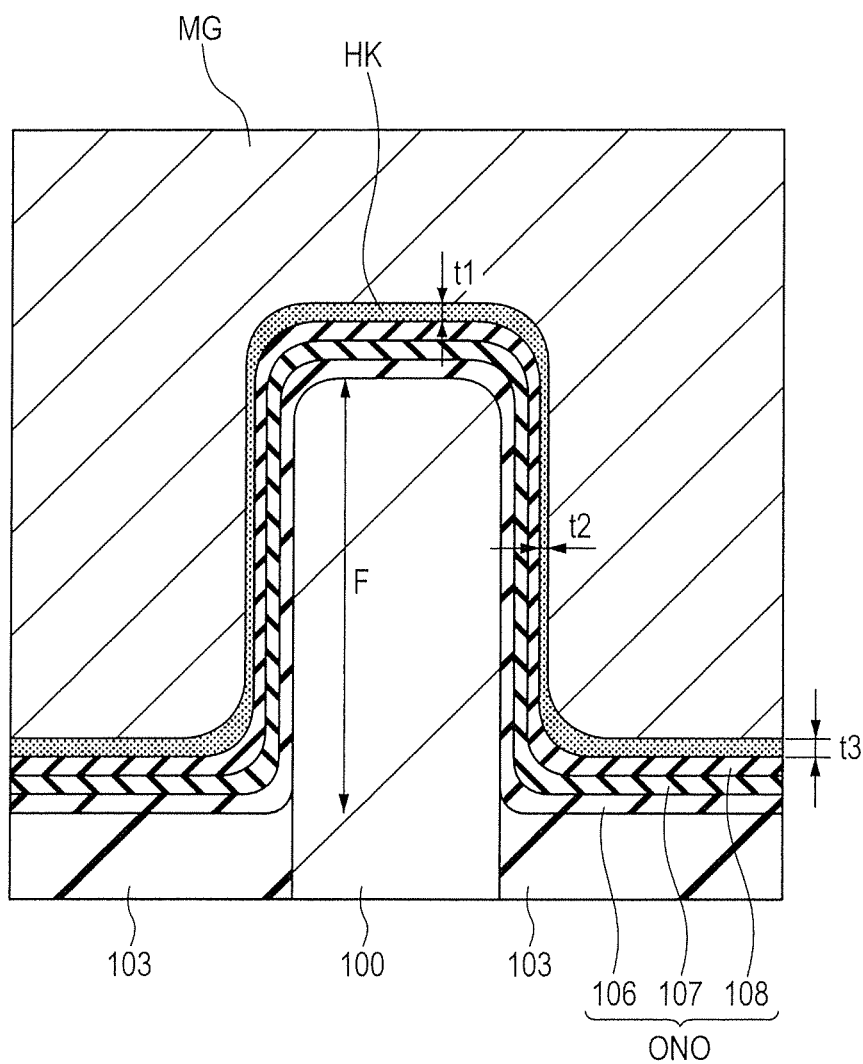
FIG. 36 is a sectional view illustrating the configuration of the semiconductor device of the fourth embodiment.

FIGS. 35 and 36 include sectional views illustrating the configuration of the semiconductor device of the fourth embodiment.

As shown in FIGS. 35 and 36, in the semiconductor device of the fourth embodiment, the high dielectric constant film HK is provided on the insulating film ONO, and has a large thickness over the top of the fin F and the top of the element isolation region 103, each top being a flat portion, while having a small thickness over each side surface of the fin F.

As described above, also in the fourth embodiment, since the high dielectric constant film HK is provided over the top of the fin F and the top of the element isolation region 103, it is possible to relax the electric field in the vicinity of each of the upper and lower corner portions of the fin F, leading to an improvement in disturbance characteristics. The high dielectric constant film HK over the side surface of the fin F is relatively thin, making it possible to reduce influence of the high dielectric constant film HK on memory operation at the side surface of the fin F.

Examples of a method for forming the high dielectric constant film HK includes the following method. A highly directional (highly anisotropic) film formation method is used for forming the high dielectric constant film HK over the fin F with the insulating film ONO in between. The highly directional film formation method includes a sputtering process. In a method for enhancing the directivity of the film, a bias potential is applied to a semiconductor substrate on which the film is to be formed, or a collimator is used. A highly directional CVD process may also be used.

Figure 37:
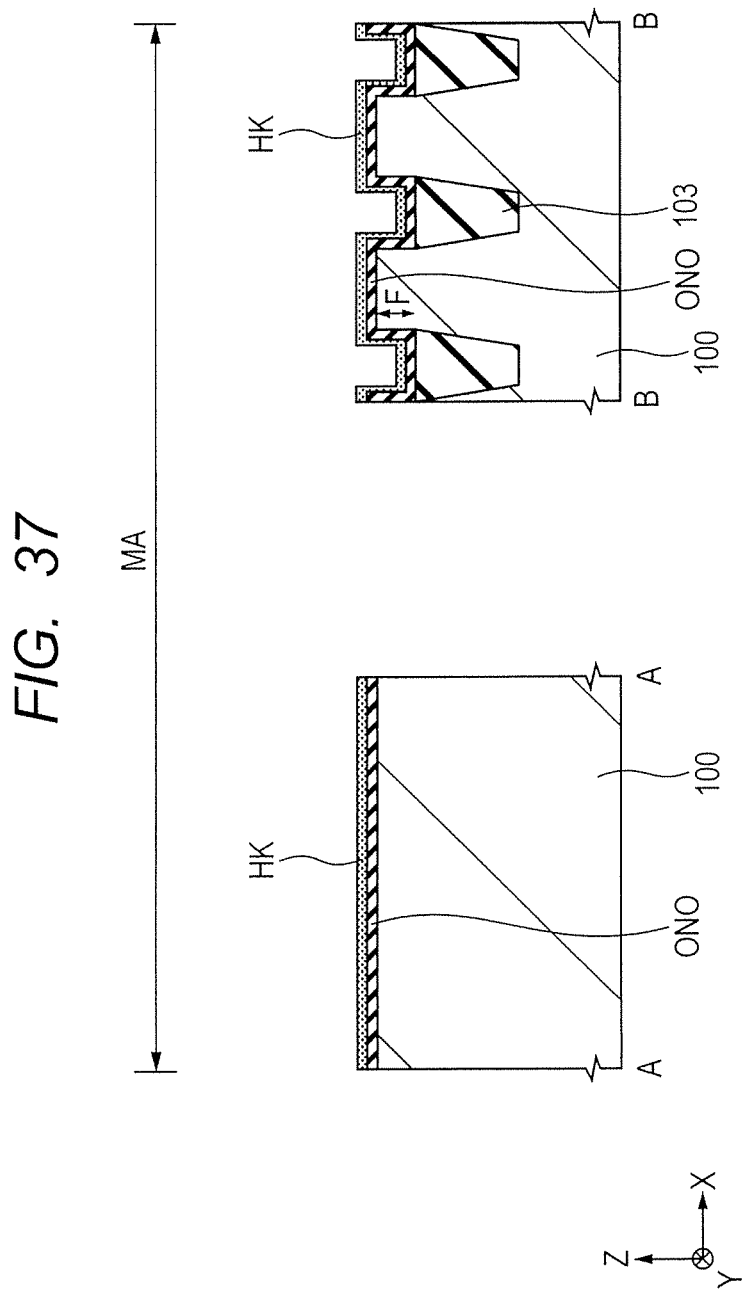
FIG. 37 includes sectional views illustrating a manufacturing process of the semiconductor device of the fourth embodiment.
Figure 38:
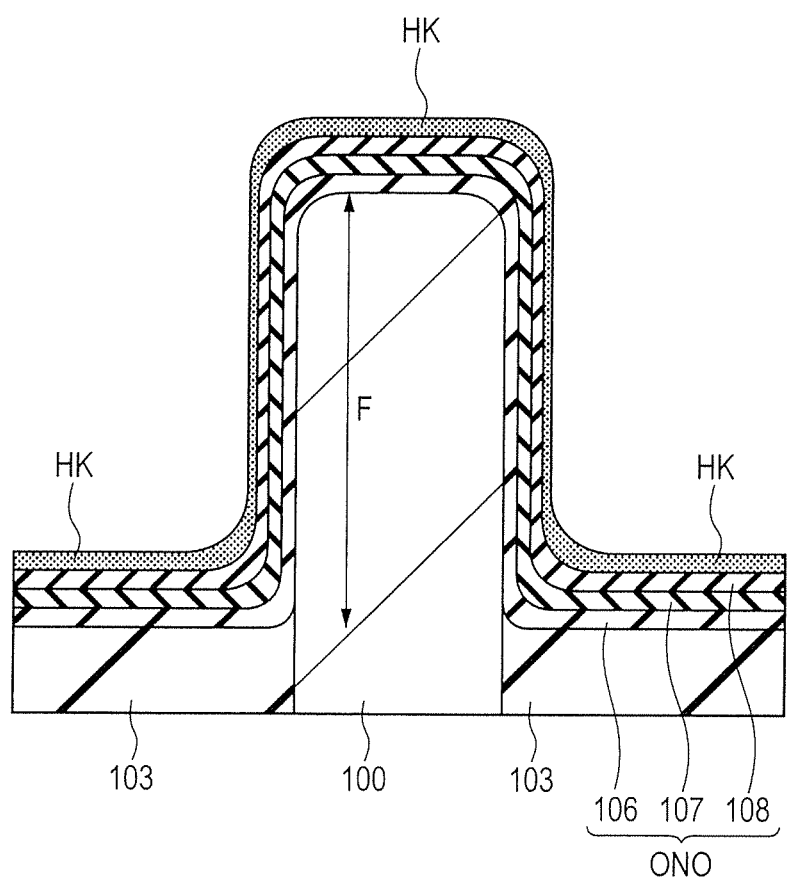
FIG. 38 is a sectional view illustrating a manufacturing process of the semiconductor device of the fourth embodiment.

FIGS. 37 and 38 include sectional views illustrating a manufacturing process of the semiconductor device of the fourth embodiment. The steps up to the step of forming the insulating film ONO (106, 107, 108) shown in FIGS. 37 and 38 are the same as those in the third embodiment.

Subsequently, the high dielectric constant film HK is formed on the insulating film ONO (106, 107, 108). For example, the high dielectric constant film HK is formed over the fin F (insulating film ONO) using a highly directional (highly anisotropic) film formation method. For example, the high dielectric constant film HK is formed using a sputtering process. Through such film formation, a thick film is deposited over the top of the fin F and the top of the element isolation region 103, each top being a flat portion, while a thin film is deposited over each side surface of the fin F. The thickness (t2) of the thin film is preferably as small as possible, but is allowed to be up to about ⅓ of the thickness (t1 or t3) of the thick film. In addition, the thickness (t2) of the thin film is allowed to be up to about 10 nm.

Thereafter, the semiconductor device can be manufactured in the same manner as in the third embodiment, such as formation of the conductive film (109) to be the memory gate electrode MG over the insulating film ONO (106, 107, 108) and the high dielectric constant film HK.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

For example, the MISFET and the dummy transistor described in the application example of the first embodiment may be disposed next to the memory cell region MA as described in the second to fourth embodiments.

[Supplementary Note 1]

A method of manufacturing a semiconductor device, the method including the steps of:

(a) forming isolation trenches extending in a first direction along a first fin extending in the first direction on both sides of a formation region of the first fin;

(b) forming an element isolation region by embedding an isolation insulating film in each of the isolation trenches;

(c) retracting a surface of the element isolation region, thereby forming a first fin having an exposed side surface;

(d) forming a first insulating film incorporating a charge storage part over the first fin and the element isolation region;

(e) forming a high dielectric constant film over the first insulating film, thereby forming a lamination film of the first insulating film and the high dielectric constant film over the first fin and the element isolation region; and (f) forming a first conductive film over the lamination film and processing the first conductive film, thereby forming a first gate electrode extending in a second direction intersecting the first direction over the first fin and the element isolation region with the lamination film in between, where in the step (e), thickness of the high dielectric constant film is larger over a top of the first fin than over a side surface of the first fin, and larger over the top of the element isolation region than over the side surface of the first fin.

[Supplementary Note 2]

The method according to supplementary note 1, where in the step (e), the high dielectric constant film is deposited by a sputtering process.

[Supplementary Note 3]

The method according to supplementary note 2, where the first insulating film includes a middle insulating film to be the charge storage part, an upper insulating film over the middle insulating film, and a lower insulating film below the middle insulating film.

[Supplementary Note 4]

The method according to supplementary note 3, where the upper insulating film and the lower insulating film are each a silicon oxide film, and the middle insulating film is a silicon nitride film.

[Supplementary Note 5]

The method according to supplementary note 4, where the high dielectric constant film is one of an $Al_2O_3$ film, a HfO film, a $Ta_2O_5$ film, a $SiTiO_3$ film, a HfSiO film, a ZrSiON film, and a HfSiON film.

[Supplementary Note 6]

A method of manufacturing a semiconductor device, the method including the steps of:

(a) forming isolation trenches extending in a first direction along a first fin extending in the first direction on both sides of a formation region of the first fin;

(b) forming an element isolation region by embedding an isolation insulating film in each of the isolation trenches;

(c) retracting a surface of the element isolation region, thereby forming a first fin having an exposed side surface;

(d) forming a first conductive film over the first fin and the element isolation region with a first insulating film in between and processing the first conductive film, thereby forming a first gate electrode extending in a second direction intersecting the first direction over the first fin and the element isolation region with the first insulating film in between;

(e) forming a second insulating film incorporating a charge storage part over the first fin, the element isolation region, and the first gate;

(f) forming a high dielectric constant film over the second insulating film, thereby forming a lamination film of the second insulating film and the high dielectric constant film over the first fin, the element isolation region, and the first gate electrode; and (g) forming a second conductive film on the lamination film and processing the second conductive film, thereby forming a second gate electrode extending in the second direction along the first gate electrode over the first fin and the element isolation region with the lamination film in between, where the step (f) of forming the high dielectric constant film includes the steps of (f1) depositing the high dielectric constant film over the second insulating film, and (f2) isotropically etching part of a surface of the high dielectric constant film, where in the step (f1), thickness of the high dielectric constant film is larger over a top of the first fin than over a side surface of the first fin, and larger over the top of the element isolation region than over the side surface of the first fin, and where after the step (f2), the high dielectric constant film is provided over the top of the first fin and the top of the element isolation region, but is not provided over the side surface of the first fin.

[Supplementary Note 7]

The method according to supplementary note 6, where in the step (f), the step (f1) and the step (f2) are repeated.

[Supplementary Note 8]

The method according to supplementary note 7, where in the step (f1), the high dielectric constant film is deposited by a sputtering process.

[Supplementary Note 9]

The method according to supplementary note 6, where the second insulating film includes a middle insulating film to be the charge storage part, an upper insulating film over the middle insulating film, and a lower insulating film below the middle insulating film.

[Supplementary Note 10]

The method according to supplementary note 9, where the upper insulating film and the lower insulating film are each a silicon oxide film, and the middle insulating film is a silicon nitride film.

[Supplementary Note 11]

The method according to supplementary note 10, where the high dielectric constant film is one of an $Al_2O_3$ film, a HfO film, a $Ta_2O_5$ film, a $SiTiO_3$ film, a HfSiO film, a ZrSiON film, and a HfSiON film.

[Supplementary Note 12]

A method of manufacturing a semiconductor device, the method including the steps of:

(a) forming isolation trenches extending in a first direction along a first fin extending in the first direction on both sides of a formation region of the first fin;

(b) forming an element isolation region by embedding an isolation insulating film in each of the isolation trenches;

(c) retracting a surface of the element isolation region, thereby forming a first fin having an exposed side surface;

(d) forming a first conductive film over the first fin and the element isolation region with a first insulating film in between and processing the first conductive film, thereby forming a first gate electrode extending in a second direction intersecting the first direction over the first fin and the element isolation region with the first insulating film in between;

(e) forming a second insulating film incorporating a charge storage part over the first fin, the element isolation region, and the first gate electrode;

(f) forming a high dielectric constant film over the second insulating film, thereby forming a lamination film of the second insulating film and the high dielectric constant film over the first fin, the element isolation region, and the first gate electrode; and (g) forming a second conductive film over the lamination film and processing the second conductive film, thereby forming a second gate electrode extending in the second direction along the first gate electrode over the first fin and the element isolation region with the lamination film in between, where in the step (f), thickness of the high dielectric constant film is larger over a top of the first fin than over a side surface of the first fin, and larger over the top of the element isolation region than over the side surface of the first fin.

[Supplementary Note 13]

The method according to supplementary note 12, where in the step (f), the high dielectric constant film is deposited by a sputtering process.

[Supplementary Note 14]

The method according to supplementary note 13, where the second insulating film includes a middle insulating film to be the charge storage part, an upper insulating film over the middle insulating film, and a lower insulating film below the middle insulating film.

[Supplementary Note 15]

The method according to supplementary note 14, where the upper insulating film and the lower insulating film are each a silicon oxide film, and the middle insulating film is a silicon nitride film.

[Supplementary Note 16]

The method according to supplementary note 15, where the high dielectric constant film is one of an $Al_2O_3$ film, a HfO film, a $Ta_2O_5$ film, a $SiTiO_3$ film, a HfSiO film, a ZrSiON film, and a HfSiON film.

What is claimed is:

1. A semiconductor device, comprising:
   a first fin extending in a first direction;
   an element isolation region extending in the first direction along the first fin on opposite sides of the first fin;
   a first gate electrode extending in a second direction intersecting the first direction and formed on the first fin and the element isolation region;
   a first insulating film formed between the first gate electrode and the first fin and including a charge storage part; and
   a high dielectric constant film formed on the first insulating film,
   wherein a surface of the element isolation region is lower than a top of the first fin, and
   wherein the high dielectric constant film comprises 1) a first portion provided on the top of the first fin and 2) a second portion provided on a top of the element isolation region while the high dielectric constant film is not provided along a side surface of the first fin between the first portion of the high dielectric constant film and the second portion of the high dielectric constant film.

2. The semiconductor device according to claim 1,
   wherein electrons are injected into the charge storage part for write, and
   wherein holes are injected into the charge storage part for erase.

3. The semiconductor device according to claim 2,
   wherein the first insulating film includes a middle insulating film to be the charge storage part, an upper insulating film over the middle insulating film, and a lower insulating film below the middle insulating film, and
   wherein the high dielectric constant film has a higher dielectric constant than any of the upper insulating film, the middle insulating film, and the lower insulating film.

4. The semiconductor device according to claim 3, wherein the upper insulating film and the lower insulating film are each a silicon oxide film, and the middle insulating film is a silicon nitride film.

5. The semiconductor device according to claim 4, wherein the high dielectric constant film is one of an $Al_2O_3$ film, a HfO film, a $Ta_2O_5$ film, a $SiTiO_3$ film, a HfSiO film, a ZrSiON film, and a HfSiON film.

6. The semiconductor device according to claim 1, further comprising:
   a second gate electrode extending in the second direction so as to be adjacent to the first gate electrode over the first fin and the element isolation region; and
   a second insulating film formed between the second gate electrode and the first fin.

7. The semiconductor device according to claim 6, wherein the first insulating film is disposed between the first gate electrode and the first fin and between the first gate electrode and the second gate electrode.

* * * * *